United States Patent [19]
Mizobuchi et al.

[11] Patent Number: 6,062,869
[45] Date of Patent: May 16, 2000

[54] METHOD OF MAKING A STACKED THIN FILM ASSEMBLY

[75] Inventors: Koichi Mizobuchi, Tsukuba; Toshihiro Sugiura, Miho-mura, both of Japan

[73] Assignee: Texas Instruments Incorporated, Dallas, Tex.

[21] Appl. No.: 08/312,207

[22] Filed: Sep. 26, 1994

[30] Foreign Application Priority Data

Sep. 24, 1993 [JP] Japan ................................. 5-261587

[51] Int. Cl.[7] ................................................ H01L 21/302
[52] U.S. Cl. ........................... 437/225; 437/192; 437/194
[58] Field of Search .................................. 437/225, 192, 437/194

[56] References Cited

U.S. PATENT DOCUMENTS 5,400,738   3/1995   Shiomi et al. .............................. 117/84

*Primary Examiner*—Charles L. Bowers, Jr.
*Assistant Examiner*—Ramamohan Rao Paladugu
*Attorney, Agent, or Firm*—Richard L. Donaldson; William B. Kempler

[57] ABSTRACT

A stacked film assembly for use as wiring in a semiconductor device having a bottom film (CVD-W film) 33 and a top film (Al alloy film) 12, where the surface roughness (Ra) of the bottom film is less than 100 Å and the crystal orientation of the top film formed on this surface is controlled, a CVD method for the making thereof, and a semiconductor device in which the stacked film assembly is employed. Even when there is no lattice matching of the bottom film and the top film, crystal orientation of the top film can be sufficiently controlled to provide a targeted face ((111) face with aluminum film), and in particular it will be possible to readily form a stacked film assembly having a satisfactory barrier function as well as sufficient EM resistance and with good film formation.

7 Claims, 26 Drawing Sheets

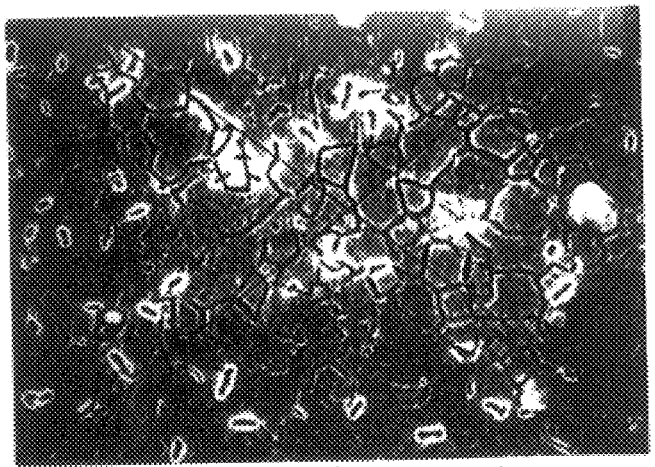
(a) TiW(0.6KÅ)/CVD-W(0.5KÅ)/AlSiCu(5KÅ)
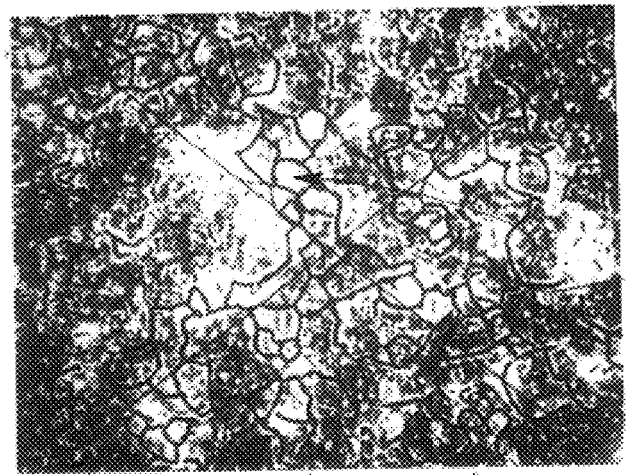
(b) TiW(0.6KÅ)/CVD-W(1KÅ)/AlSiCu(5KÅ)
— Al CRYSTAL GRAIN (GRAIN)
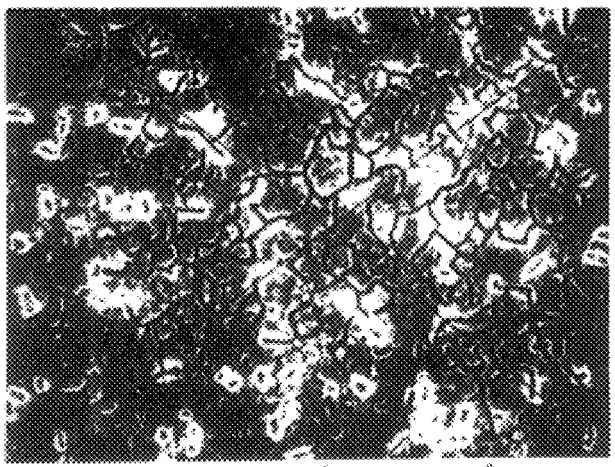
(c) TiW(0.6KÅ)/CVD-W(2KÅ)/AlSiCu(5KÅ)
1um
Fig. 6

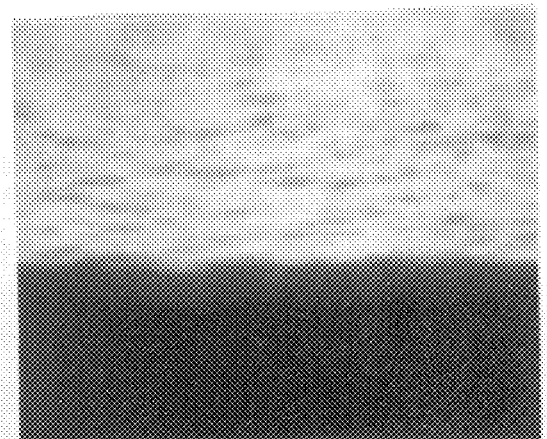
(a) TiW(0.6KÅ)/CVD-W(V.F.0.5KÅ):
Ra=63Å
(d) TiW(0.6KÅ)/CVD-W(NUC+V.F.1KÅ):
Ra=81Å
(b) TiW(0.6KÅ)/CVD-W(V.F.1KÅ):
Ra=95Å
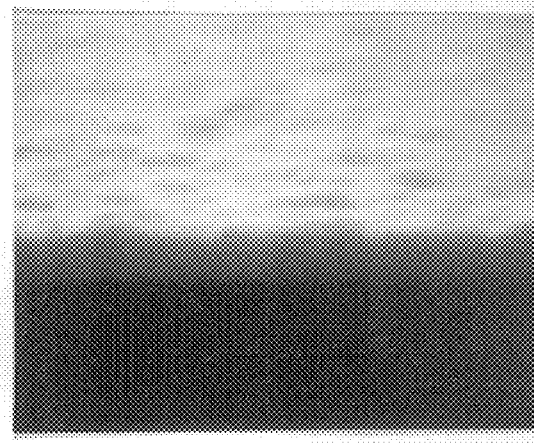
(e) TiW(0.6KÅ)/CVD-W(I.C.1KÅ):
Ra=65Å
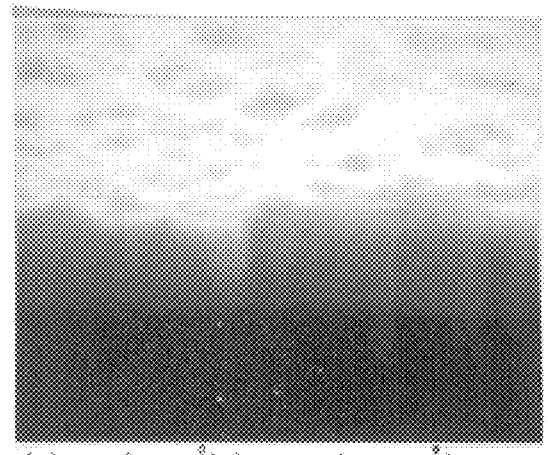
(c) TiW(0.6KÅ)/CVD-W(V.F.2KÅ):
Ra=197Å
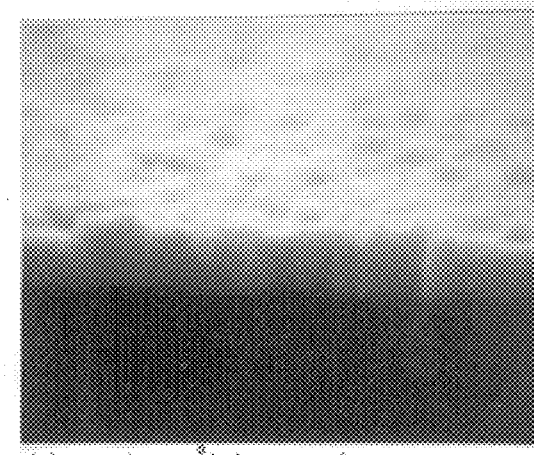
(f) TiW(0.6KÅ)/CVD-W(NUC+V.F.no-N$_2$ 1KÅ): Ra=110Å
1KÅ
*Fig. 7*

FIG. Al(111) POLE FIGURE OF AlSiCu (500nm)/CVD-W(100nm)/TiW(60nm) MULTILAYERS

FIG. A1(111) POLE FIGURE OF AlSiCu (500nm)/CVD-W(100nm) /TiW(60nm) MULTILAYERS.

Fig.15 GRAIN SIZE MEASUREMENT OF TiW/CVD-W/AlSiCu FILM USING TEM

Fig.16 GRAIN SIZE MEASUREMENT OF TiW/CVD-W/AlSiCu FILM USING AFM

AFM IMAGE OF SAMPLE

METHOD OF MAKING A STACKED THIN FILM ASSEMBLY

This invention pertains to a stacked film assembly (particularly aluminum wiring that has a barrier metal layer as the underlying film), its method of formation and a semiconductor device (for example, a dynamic random access memory: DRAM) employing same.

BACKGROUND OF THE INVENTION

It is already known that when aluminum thin film is used as wiring material, the direction of the crystal particles and crystal particle diameter affect deterioration, e.g., wire breakage due to electromigration (abbreviated EM hereafter).

In short, the life of aluminum wiring until it disconnects because of EM (EM resistance): MTF (mean time to failure) is expressed by the following formula, based on experience, of S. Vaidya.

$$MTF\alpha(S/\sigma^2) \log (I_{111}/I_{200})^3 \ldots \qquad (1)$$

Where, S: aluminum polycrystal grain diameter
σ: variation in this crystal grain diameter
$I_{111}$: (111) face X-ray diffraction intensity
$I_{200}$: (200) face X-ray diffraction intensity According to the formula (1), as the crystal grain diameter increases, variation becomes smaller, and the fact that crystal grain orientation (phenomenon where crystal direction follows a specific direction) is controlled by the (111) face crystal direction is important for improving EM resistance.

Prior to this, aluminum wiring has used a construction, as shown in FIG. 30, where it is applied to contact hole 4 of insulation layer 3 on semiconductor substrate 1 as a single layer film 12 and conducts on insulation layer 3 by connection to a specific semiconductor region 22. With this type of single layer aluminum wiring 12, however, aluminum atoms diffuse toward the semiconductor substrate during annealing or heating, forming an Al-Si alloy. Spike alloy 10 shown in FIG. 30 is readily produced, and if this reaches pn junction 11, there will be a problem with shorting between wiring 12 and substrate 1. Because of this, even if the aluminum crystal diameter is controlled as described above, EM resistance will be insufficient.

So, as shown in FIG. 31, barrier metal film 13, to prevent aluminum atom diffusion, is provided beneath aluminum film 12, and the formation of wiring with this stacked structure having aluminum film 12 and barrier metal film 13 is widely used.

The use of titanium nitride (TiN), for example, as the barrier metal film 13 is already known. Along with the barrier function of TiN, Al crystal orientation is controlled by controlling the TiN crystal orientation. In other words, this takes advantage of certain characteristics. By controlling TiN crystal orientation to (111), Al crystal orientation will follow the (111) face orientation. With TiN and Al made of the same face centered cubic construction: FCC, the lattice constants of the two are comparatively close, 4.2417 Å for TiN and 4.0494 Å for Al, and the Al (111) crystal face will grow in conformity to the TiN (111) crystal face.

This TiN/Al stacked film, has the problems shown in (1)–(6) below, however.

(1) TiN is applied by reactive sputtering or Ti is nitride-treated after sputtering. In either case, as shown in FIG. 32, when the TiN applied by sputtering or Ti 13 is particularly thin where it adheres to the inside of contact hole 14, defects occur readily, and the material in this state cannot function as an underlying layer (barrier metal) for the aluminum film applied as the top layer. If the film is made thicker, it will adhere together above contact hole 4, as indicated by the imaginary lines, completely blocking contact hole 4. With the top aluminum film unable to adhere inside contact hole 4, contact defects can easily occur. In either case, since sputtering is used, there is a tendency for step coverage to be poor, and conditions for uniform application are limited.

(2) Since the work function difference between TiN and n-type silicon and p-type silicon is very large, electrical contact of TiN film 13 alone to a silicon substrate (semiconductor region 22 above) is difficult. To improve this, a metal film, Ti, etc., must be used as an underlying layer for TiN film 13. Thus, even when TiN is applied only to contact hole 4, i.e., so-called selective formation (selective-TiN), electrical contact will not be obtained.

(3) In addition, even when TiN is formed from contact hole 4 on insulation film 3, as a so-called blanket type, electrical contact is not obtained with TiN alone.

(4) TiN film 13, which serves as the aluminum film underlying layer, has the same (111) crystal plane orientation as the aluminum, so crystal direction may be over-aligned. With annealing or heating, aluminum atoms readily diffuse toward the semiconductor substrate along the TiN crystal grain boundaries through the TiN film, and a spike alloy as described above may be created.

(5) Controlling TiN crystal orientation to the (111) face requires special conditions. That is, for film formation conditions, TiN is deposited by controlling substrate bias during reactive sputtering, or Ti deposited by sputtering is nitrided by lamp illumination in N2. In addition, depending on the degree of nitriding, reproducibility of the crystal orientation may be insufficient.

(6) The problems as described in the aforementioned (1)–(5) paragraphs occur not only when TiN is applied to the contact hole, but also when TiN is applied to the insulation layer with through-holes, when multilayer wiring that connects upper and lower wiring layers is applied. Furthermore, the same unavoidable problems occur even when wiring is drawn around over the insulation film.

Even in wiring that has a stacked structure other than the aforementioned TiN/Al stacked film, the same problems may occur. A stacked film assembly with a barrier function and sufficient EM resistance with good film formation and that can be formed easily has been desirable.

It is an object of this invention to provide a structure and method where crystal orientation of the top film can be satisfactorily controlled, and with which a stacked film assembly with sufficient barrier function and EM resistance can be formed satisfactorily and easily, by controlling the properties of the underlying film from a perspective different from that of the prior art.

SUMMARY OF THE INVENTION

In short, this invention pertains to a stacked film assembly made with a stacked structure having a bottom film and a top film. The surface roughness (Ra) of the bottom film will be less than 100 Å, and the crystal orientation of the top film as formed on the surface of the bottom film will be controlled.

In investigating stacked film assemblies, particularly using aluminum film (actually, these may be alloy films that contain small quantities of Si and Cu) as the top film, it has been discovered, in accordance with the invention, that even when there is no lattice matching of the bottom layer to the aluminum film, as there is with TiN, by keeping the surface roughness (Ra) of the bottom layer in a specific range, i.e., less than 100 Å, crystal orientation of the top layer can be controlled to what is targeted ((111) face, with aluminum film).

For example, when tungsten film that can be formed with chemical vapor deposition (CVD-W) is formed as the bottom film, the crystal structure of this CVD-W film will have a body centered cubic construction: BCC (lattice constant of 3.165 Å different from that of the aluminum and its crystal direction will be a mix of (110) and (200). Regardless of the fact that, with no lattice matching with the aluminum (111) crystal face, control of the aluminum crystal orientation is not possible by controlling the crystal orientation of the bottom film as described above, it has been established, in accordance with the invention, that the aluminum (111) crystal face orientation depends on the surface roughness Ra of the CVD-W film that serves as the bottom film.

In short, X-ray diffraction intensity of the top film Al (111) face changes depending on the surface roughness Ra of the CVD-W film serving as the bottom film, as shown in FIGS. 1 and 2. In particular, when the surface roughness Ra of the CVD-W film is kept at less than 100 Å (10 nm), the X-ray diffraction intensity of the Al (111) face is greatly increased. In other words, Al (111) face crystal orientation is increased, and sufficient EM resistance can be realized.

The fact that the top layer crystal orientation can be controlled to that targeted by controlling surface roughness Ra, even with a bottom film whose crystal faces do not match those of the top film, is based on an epoch making concept that could not have been imagined in the prior art. In particular, if the bottom film is made of CVD-W film, the results are even more remarkable, as shown in the following (a)–(f).

(a) Since the bottom film is formed by CVD (chemical vapor deposition), satisfactory adhesive ability of the bottom film within contact holes and through-holes will be provided, whether the film is thick or thin. An aluminum atom diffusion prevention function (barrier function) as well as improved contact ability will be achieved with this bottom film. In particular, it is extremely significant that formation of low resistance wiring and interlayer connection can be realized simultaneously by taking advantage of the excellent characteristics of aluminum film, which has low absolute resistance, as the top layer, and CVD-W film, which has good step coverage ability, as the bottom layer in a stacked thin film assembly.

(b) For example, $WF_6$, which can be used when CVD-W film is formed, is much more electronegative than silicon. Thus, it is readily adsorbed onto the silicon substrate, and the W-F feed is readily cut off by electrons fed from the silicon. Due to this, thermal decomposition of $WF_6$ is promoted at the silicon surface, W is readily deposited onto this surface, and CVD-W with good adhesive ability will be deposited on the semiconductor substrate. Thus, this is particularly effective for the selective formation described above, and an underlying layer is not required.

(c) The bottom CVD-W film has no lattice matching to the aluminum, so aluminum atom diffusion along crystal grain boundaries, which is seen with TiN film as already stated, does not occur. Thus, the spike alloy described previously is not created, and the functioning of the bottom CVD-W film as a barrier metal will be sufficient.

(d) CVD-W film can be formed with normal CVD film formation conditions, which can be used to form film easily without applying the special equipment or treatment typical of TiN film formation. Furthermore, control of the top film orientation can be realized, with good reproducibility, primarily by only controlling the surface roughness (Ra) of the bottom film.

(e) When the bottom film is formed by CVD, the crystal grain diameter of the top film can be kept sufficiently large regardless of the film-forming conditions of the bottom layer (particularly changes in bottom film thickness), and this will also be effective for keeping EM resistance satisfactory.

(f) The effects described in paragraphs (a)–(e) can be obtained not only with the aforementioned selective formation and blanket film formation applied to a contact hole, but also for application to through-holes during multilayer wiring formation. In addition, it is also effective for drawing wire around and over the insulation film.

However, when the CVD-W is formed into a blanket-type film, the electronegativity of $WF_6$ is close to that of $SiO_2$, so it is difficult to deposit this onto the $SiO_2$ with satisfactory adhesion. For this reason, an adhesive film (Ti-W alloy film, for example) should be formed as an underlying layer for the bottom film.

As already discussed, the stacked film assembly as constructed in accordance with this invention has outstanding characteristics in that the surface roughness (Ra) of the bottom film is specifically less than 100 Å; the following means is primarily used to reduce the surface roughness Ra in this way to the specified range.

First, the thickness of the bottom film should be reduced, and preferably should be less than 1000 Å (less than 100 nm). This can easily be realized by controlling CVD conditions (film formation time, for example). In other words, it is clear, as shown in FIG. 1, that the surface roughness Ra of the CVD-W film can be kept less than 100 Å in accordance with this invention if the CVD-W film thickness is less than 1000 Å.

Due to the fact that CVD-W film thickness can be reduced in this way, the effect in (g) below can also be obtained, in addition to the aforementioned effects.

(g) Patterning by etching is difficult with a CVD-W/Al stacked film assembly formed in accordance with this invention, but since the CVD-W film can be made thinner than 1000 Å, etching will be easy, and patterning precision that is as designed can be achieved.

As other means of controlling the surface roughness Ra of the bottom film, the following two methods for film formation conditions with CVD can be used.

First there is the interconnect method (hereafter called the I.C. method) in which, when a stacked film assembly made of a structure with bottom and top films is formed, a chemical gas (e.g. $WF_6$) with the structural elements of the aforementioned bottom layer is fed in, this is broken down under the circulation gas (hydrogen, for example) feed limiting conditions, and the bottom layer (e.g. W or tungsten) is formed by chemical vapor deposition of the aforementioned structural elements.

Secondly, there is the nucleation method and the via fill method, i.e., (NUC.+V.F.) where, when a stacked film assembly made of a structure with bottom and top films is formed, the nucleation method may be first employed by feeding in a chemical gas (e.g. $WF_6$) with the structural elements of the bottom layer. After this chemical gas is broken down using a first circulation gas ($SiH_4$, for example) that is highly reactive. This nucleation procedure provides for a very low deposition rate of the desired metal as compared with the via fill (i.e. V.F.) method and is employed to nucleate or seed a metal (e.g. W or tungsten) onto a substrate, such as $SiO_2$, W, TiW, Al—Si—Cu etc. with a very thin thickness such as 500 Å. Following nucleation, the via fill method is employed where the chemical gas (e.g. $WF_6$) is broken down under surface reaction limiting conditions that use a second circulation gas (H$_2$, for example) that has low reactivity in place of the first circulation gas. The bottom layer is formed by vapor phase epitaxy of the aforementioned structural elements.

In other words, as shown in FIG. 2, the surface roughness (Ra) of the CVD-W film formed by the I.C. method or (NUC.+V.F.) method can be kept to less than 100 Å, and satisfactory control of the top layer (111) crystal face can be realized. This corresponds to the trend shown in FIG. 1.

With the I.C. method, the circulation gas should be made rich in H$_2$ relative to the reaction gas, WF$_6$, and the speed of the reaction can be set by the H$_2$ feed rate. With the (NUC.+V. F.) method, WF$_6$ is first broken down by the action of the SiH$_4$ circulation gas in the NUC portion of the method, and a W film is deposited as seed. A second W film will be deposited on the seed W film by V.F. by breakdown of WF$_6$ under normal conditions.

In this (NUC.+V.F.) method, since the surface of the W film produced by V.F. is easily roughened, and film formation speed by NUC. can be reduced, the thickness ratio of each W film formed with these methods should be controlled. The bottom film should be formed so that the ratio of the thickness of W film produced with NUC. and the thickness of W film produced with V.F. should be (5:5)–(3:7).

Note that, in the stacked film assembly as constructed in accordance with this invention, it is essential that the surface roughness Ra of the bottom film be less than 100 Å, but it is further preferable that the surface roughness Ra be less than 65 Å (and correspondingly, that the thickness of the bottom film be less than 500 Å). This can be understood from the results in FIG. 1 (for films produced by V.F.). In addition, the fact that the I.C. method is preferable as the film formation method for the bottom film can also be understood from the results in FIG. 2.

The surface roughness Ra of this bottom film will be in accordance with Japanese Industrial Standard JIS 0601 for surface roughness and is defined in the following way (the same hereafter). In short, Ra (center line average roughness) is given by the following equation, when the measured length L is taken from the roughness curve in the direction of the center line, the center line is the X axis, the longitudinal magnification direction is the Y axis, and the roughness curve is expressed by y=f(X).

$$Ra = 1/L \int |f(X)| dx \quad (2)$$

In addition, measurement of the roughness curves was carried out primarily using a known AFM (atomic force microscope: NANO SCOPE, made by Digital Instruments Co.).

Crystal orientation and crystal grain diameter of the stacked film assembly were measured using known X-ray diffraction (XRD) and SEM (scanning electron microscope) techniques.

In addition, this invention also provides a semiconductor device in which the stacked film assembly is provided on a semiconductor substrate. In particular, the invention can provide a semiconductor integrated circuit device, e.g., DRAM, having a structure in which a stacked film assembly is formed as wiring on an insulation film containing contact holes or through-holes (blanket type), or a structure in which a bottom film of the stacked film assembly is selectively formed as the underlying conductor for the top film only in contact holes or through-holes (selective formation type).

BRIEF DESCRIPTION OF THE DRAWINGS

FIG. 6 shows SEM photographs showing the top film (Al alloy film) Al crystal grains when the thickness of a CVD-W film, in a stacked film assembly that has a CVD-W film formed by the V.F. method, was varied.

FIG. 7 shows SEM photographs which show the surface roughness of CVD-W films formed by each of various methods.

Figure 1:
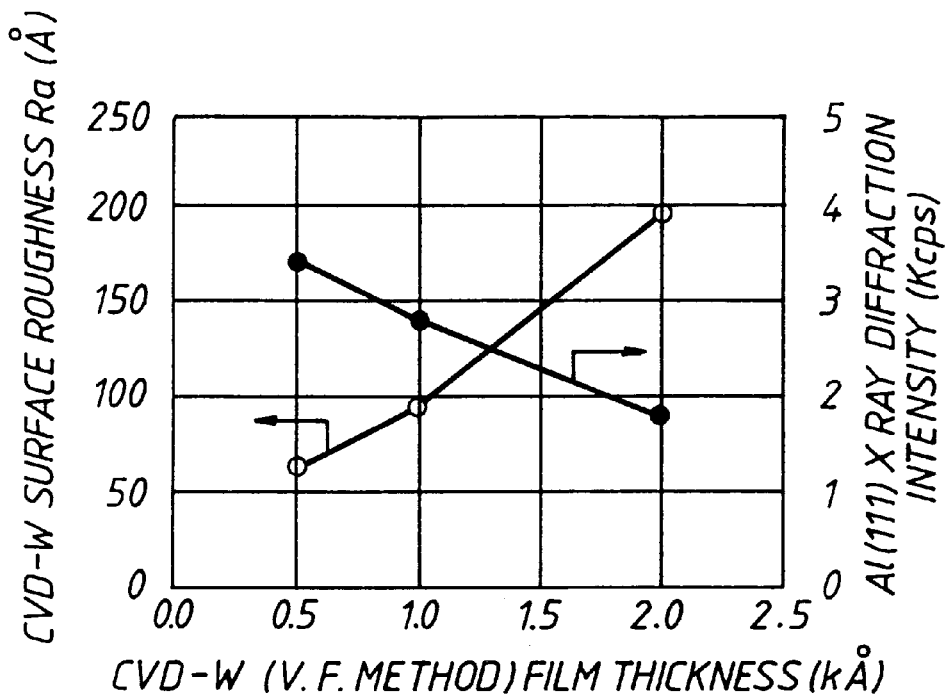
FIG. 1 is a graph showing changes in CVD-W film surface roughness and top film (Al alloy film) (111) X-ray diffraction intensity depending upon the film thickness of CVD-W film formed by the V.F. method.

Reference numerals as shown in the drawings:

1 . . . semiconductor substrate
3 . . . insulating layer ($SiO_2$)
4 . . . contact hole
12 . . . Al alloy film
13 . . . TiN film
22 . . . semiconductor region
31 . . . TiW film
33 . . . CVD-W film
34 . . . reflection prevention film

DESCRIPTION OF PREFERRED EMBODIMENTS

Figure 26:
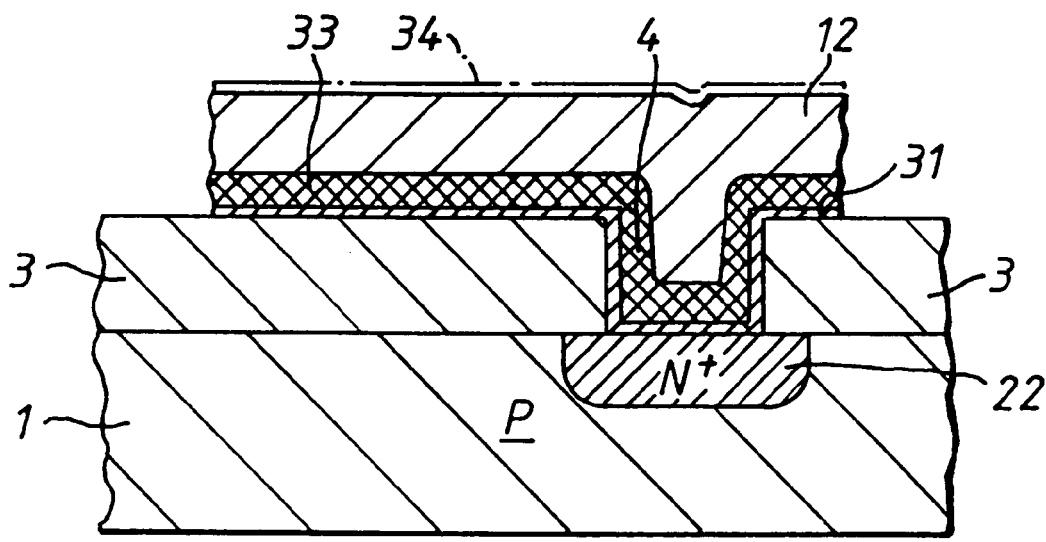
FIG. 26 is a cross sectional view of a semiconductor device having a stacked film assembly formed as wiring (blanket type).

The stacked film assembly based on this invention uses as its basis, as shown in FIG. 26, a stacked structure of CVD-W film 33, formed with the chemical deposition described below, and aluminum film 12, formed with known sputtering, CVD, or vapor deposition. In addition, it has adhesion or sticking film 31, made of TiW, etc. by known sputtering as the underlying layer for CVD-W film 33, and is formed over insulation layer 3 from contact hole 4.

Based on this invention, surface (boundary with aluminum film 12) roughness Ra of CVD-W film 33 is controlled to less than 100 Å, and its thickness is less than 1000 Å. Aluminum film 12 is formed with a thickness of, for example 5000 Å–6000 Å, and is made of aluminum alloy with a small quantity of Si and Cu mixed in, to prevent alloy spikes and increase EM resistance. Adhesive film 31 is formed with a thickness of, for example, 600 Å, and may be made from a variety of materials, including Ti-W (specific resistance of 50–60 mΩ-cm), TiN (specific resistance 70–200 mΩ-cm), W (specific resistance approx. 13 mΩ-cm).

| TYPE | FILM FORMATION CONDITIONS | FILM FORMATION TIME | EXAMPLE OF CVD-W FILM SPECIFIC RESISTANCE |
| --- | --- | --- | --- |
| I.C. METHOD (FEED DETERMINATION) | Pressure = 80 Torr<br>Temperature = 442° C.<br>Gas Flow Rate =<br>Ar: 2200 sccm<br>$N_2$: 20 sccm<br>$WF_6$: 36 sccm<br>$H_2$: 1800 sccm | 1000 Å/17 sec | 8 μΩ - cm |
| NUC. METHOD ($SiH_4$ REDUCTION) | Pressure = 1 Torr<br>Temperature = 442° C.<br>Gas Flow Rate =<br>Ar: 300 sccm<br>$N_2$: 30 sccm<br>$SiH_4$: 5 sccm<br>$WF_6$: 500 sccm | 500 Å/40 sec | 11–12 μΩ - cm |
| V.F. METHOD (SURFACE REACTION RATE DETERMINATION) | Pressure = 80 Torr<br>Temperature = 442° C.<br>Gas Flow Rate =<br>Ar: 2200 sccm<br>$N_2$: 300 sccm<br>$WF_6$: 60 sccm<br>$H_2$: 500 sccm | 500 Å/11 sec<br>1000 Å/17 sec<br>2000 Å/27 sec | 9–10 μΩ - cm |

The methods for forming CVD-W film 33 are explained. In the methods, there are the I.C. method, the NUC method, the V.F. method, and a method (NUC.+V.F.) combining the NUC. method and the V.F. method, etc.

In addition, film formation conditions for TiW film 31 and aluminum (AlSiCu) film 12 are as follows.

TiW film 31: pressure=10 mtorr, temperature=200° C., output=2 kW, time=23 sec.

AlSiCu film 12: preheating=200° C. pressure=7 mtorr, output=12 kW, time=25 sec, with no heating during sputtering.

So, CVD-W film 33 was formed of various thicknesses with each of the film formation methods, AlSiCu alloy film 12 was layered on the CVD-W film 33, and all measurements were performed.

For the CVD-W/AlSiCu stacked thin film assembly, CVD-W film thickness was varied from 2 kÅ to 0.5 kÅ. After AlSiCu sputtered film formation, heat treatment at 450° C. ($H_2$ atmosphere) for 30 min was applied. The Al crystal direction in this sample was examined using XRD (Θ–2Θ method), with the results being shown in FIG. 3. Al (111) diffraction intensity showed a tendency to increase as the CVD-W film became thinner. (110) and (200) diffraction peaks were observed from the CVD-W film, and the (200)

diffraction intensity showed a tendency to become smaller along with decreased film thickness.

Figure 5:
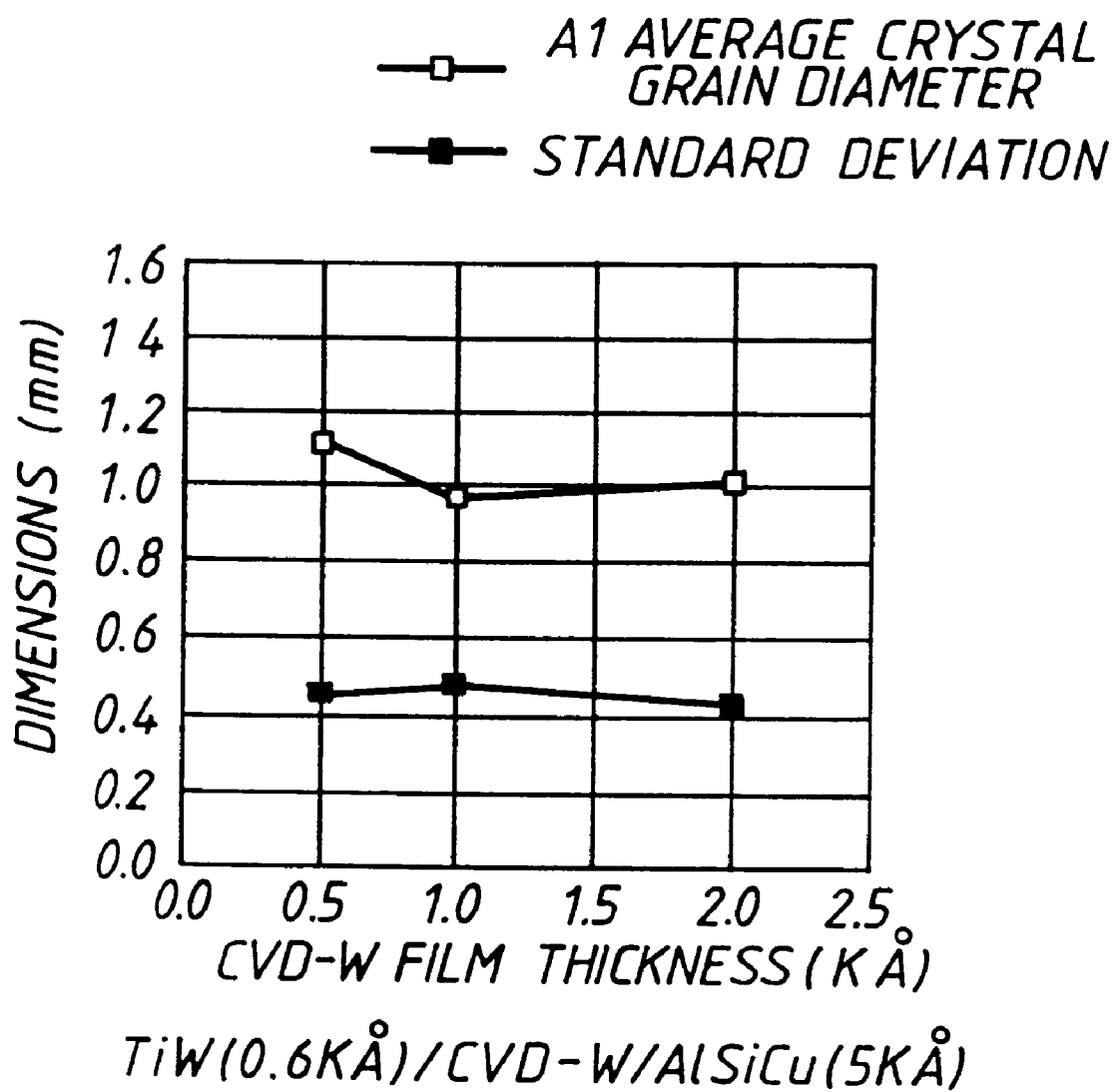
FIG. 5 is a graph showing changes in the top film (Al alloy film) Al crystal grain size depending upon CVD-W film thickness in a stacked film assembly that has a CVD-W film formed by the V.F. method.

Al crystal grain diameter was measured for the same sample using SEM; the results are shown in FIG. 5, and the SEM observation photographs are shown in FIG. 6. Al crystal grain diameter does not greatly depend on CVD-W film thickness, and was somewhat greater in the 0.5 kÅ sample than the others.

Center line average roughness (Ra), measured using SEM photographs and AFM for samples where CVD-W film thickness was varied from 2 kÅ to 0.5 kÅ (V.F. method films) and CVD-W film thickness was fixed (1 kÅ) and surface roughness changed by changing film formation conditions, is shown in FIG. 7. Surface roughness of the CVD-W film (V.F. method film) had a tendency to decrease as film thickness decreased. In addition, it can be seen that even in the same film thickness, surface roughness can be controlled by changing film type.

Figure 3:
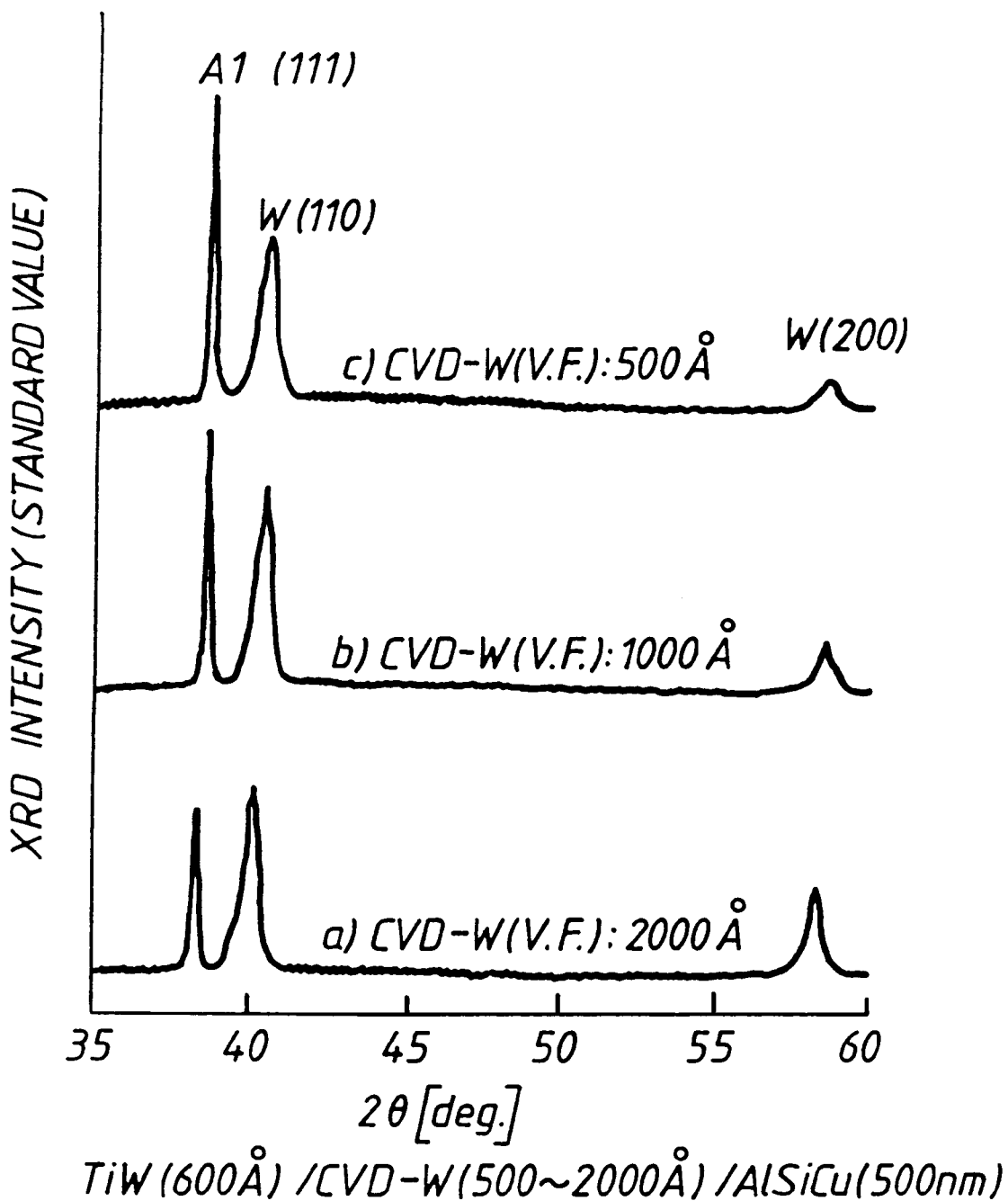
FIG. 3 is an X-ray diffraction spectrum diagram for CVD-W film thickness in a stacked film assembly (TiW/CVD-W/AlSiCu) that has a CVD-W film formed by the V.F. method.

From the results in FIGS. 3 and 7, the relationship between surface roughness of the CVD-W film (V.F. method film) where film thickness was varied from 2 kÅ to 0.5 kÅ, and Al (111) diffraction intensity of the AlSiCu film formed on these films and heat treated, is shown in FIG. 1. CVD-W film surface roughness decreases with a decrease in CVD-W film thickness, and Al (111) diffraction intensity shows a tendency to increase. In particular, it can be seen that, by making CVD-W film thickness less than 1 kÅ (or further, less than 0.5 kÅ), and making its surface roughness (Ra) less than 100 Å (or further, less than 65 Å), Al (111) diffraction intensity will increase.

Figure 2:
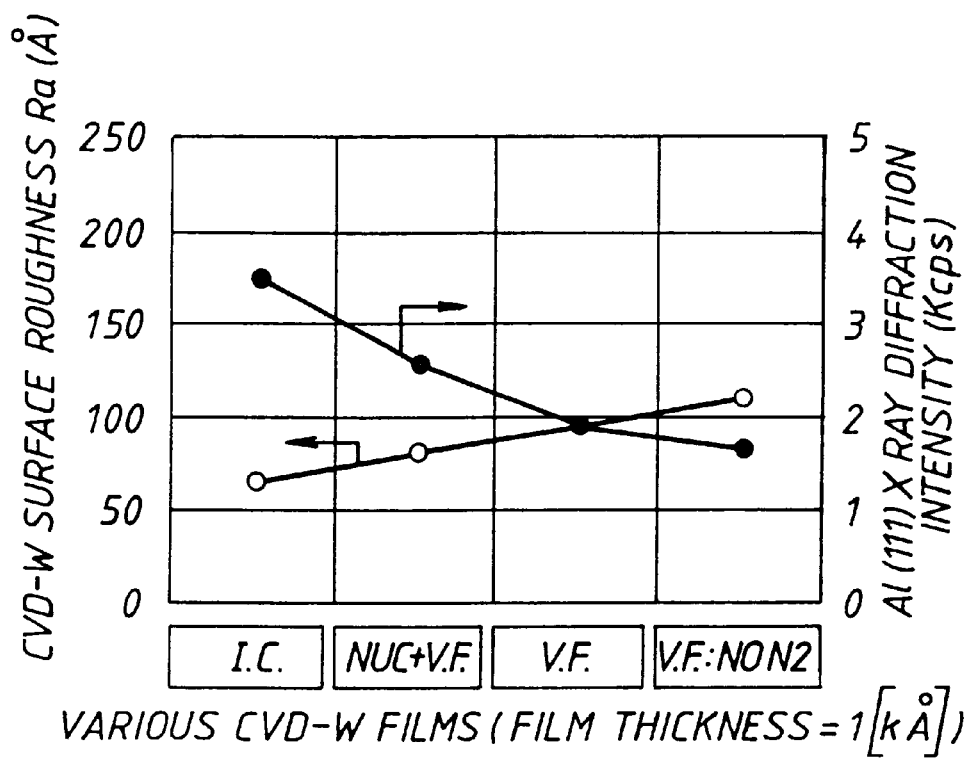
FIG. 2 is a graph showing changes in CVD-W film surface roughness and top film (Al alloy film) (111) X-ray diffraction intensity depending upon the film thickness of CVD-W film formed by each of various methods.
Figure 4:
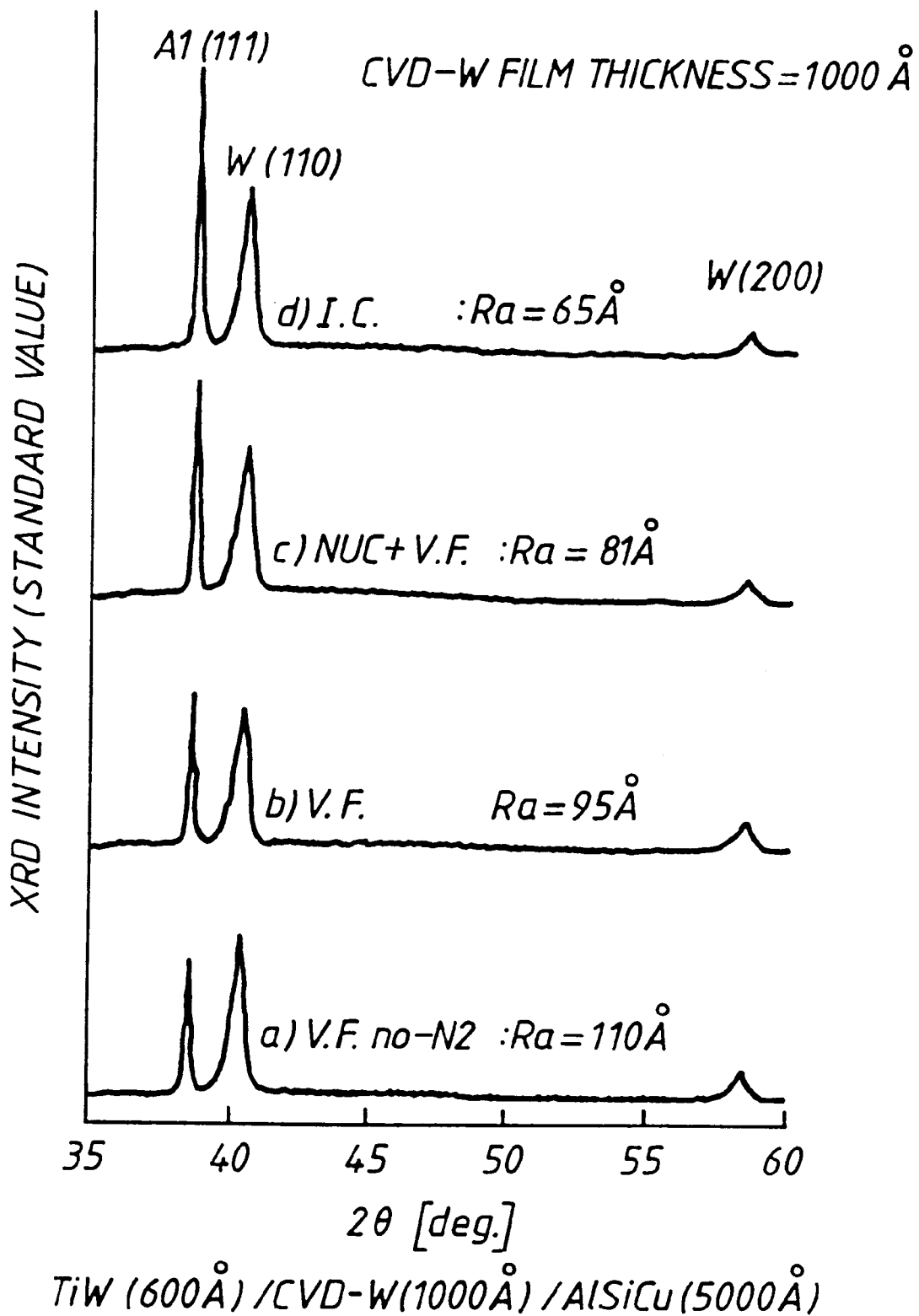
FIG. 4 is an X-ray diffraction spectrum diagram corresponding to CVD-W surface roughness in a stacked film assembly (TiW/CVD-W/AlSiCu) that has a CVD-W film formed by each of various methods.

Crystal direction in the CVD-W/AlSiCu stacked film assembly, when CVD-W film thickness was fixed (1 kÅ) and surface roughness was changed, was examined using the XRD (Θ–2Θ) method; the results are shown in FIG. 4. In addition, from these results, the relationship between CVD-W film surface roughness and Al (111) diffraction intensity is shown in FIG. 2. According to this, Al (111) diffraction intensity shows a tendency to increase as CVD-W film surface roughness decreases. In particular, it can be seen that, by using the I.C. method or (NUC.+V.F.) method as the method of film formation, the surface roughness Ra of CVD-W film can be set at less than 100 Å (or further, less than 65 Å), and Al (111) diffraction intensity will be increased.

Figure 8:
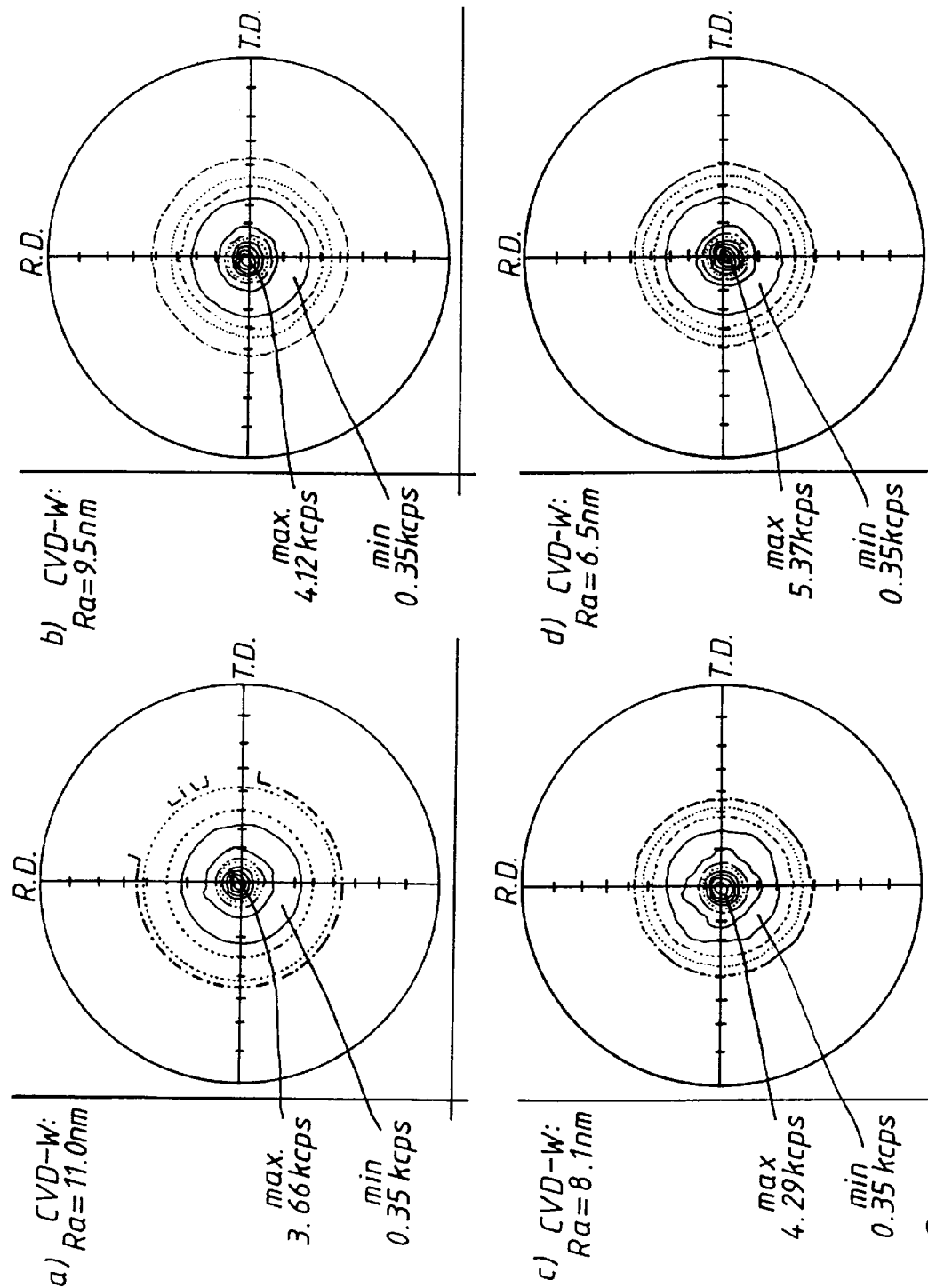
FIG. 8 is an X-ray diffraction diagram produced with the pole graphic method and based upon the surface roughness of a CVD-W film in a stacked film assembly.

Here, since it is difficult to explain crystal orientation characteristics only with the Θ–2Θ method, these orientation characteristics will be accurately explained using a pole graphic method (Schulz reflection method) as shown in FIG. 8. Pole measurement is a method in which diffraction intensity for a specific crystal face for each orientation in a sample is determined, and this crystal face pole distribution density is represented by a diffraction intensity equivalent height line using stereo photography. With positive pole measurement, the Schulz reflection method is used. Θ–2Θ is fixed to the Bragg angle of the desired crystal face, and by scanning at angle d around the sample normal line and at angle a around the horizontal axis, crystal face diffraction intensity for the desired direction is measured.

Figure 9:
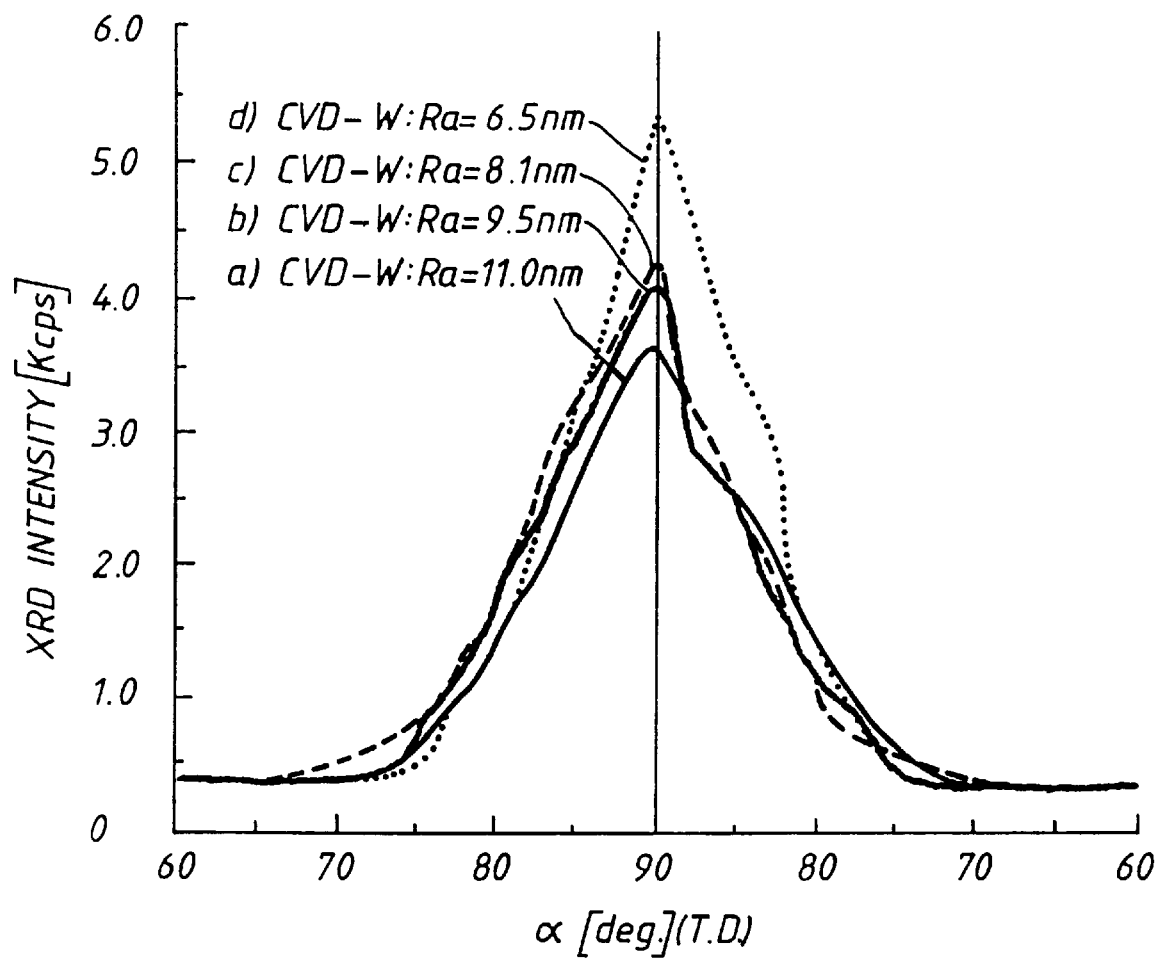
FIG. 9 is an X-ray diffraction spectrum diagram in the transverse direction with the same pole graphics employed with respect to FIG. 8.

From the data in FIG. 8, and from the data in FIG. 9, viewed at T.D. (transverse direction) orientation cross section, it can be seen that the Al was oriented to (111). From the maximum intensity difference for these orientation characteristics observed at α=90°, it was verified that the Al (111) orientation increases as CVD-W film surface roughness decreases.

On the other hand, the presence or absence of lattice matching of the CVD-W film and AlSiCu film will be explained. In samples where CVD-W film thickness was changed, an increase in Al (111) orientation was seen with a corresponding reduction in CVD-W (200) diffraction intensity. In CVD-W films where film thickness was fixed (1 kÅ) and film formation conditions were changed, this correlation was not observed. The Al crystal is an FCC (face centered cubic) structure and its lattice constant is a =4.0497 Å. The CVD-W crystal is a BCC (body centered cubic) structure and its lattice constant is a=3.1653 Å. So, it is clear that there was no matching of CVD-W (200) and Al (111).

From the above, Al (111) orientation in the CVD-W/AlSiCu stacked thin film assembly depends on CVD-W surface roughness, and the unevenness of the underlying layer affects the Al crystal direction. Thus, by controlling surface roughness of the underlying CVD-W film so that it is less than 100 Å, in accordance with this invention, it is possible to control Al (111) orientation, and so it will be possible to form thin films that will produce increased reliability, e.g., EM resistance. In addition, Al (111) diffraction intensity showed a tendency to increase as the CVD-W film became thinner. In addition, Al crystal grain diameter was about 1 μm, with no significant dependence on CVD-W film thickness.

Figure 10:
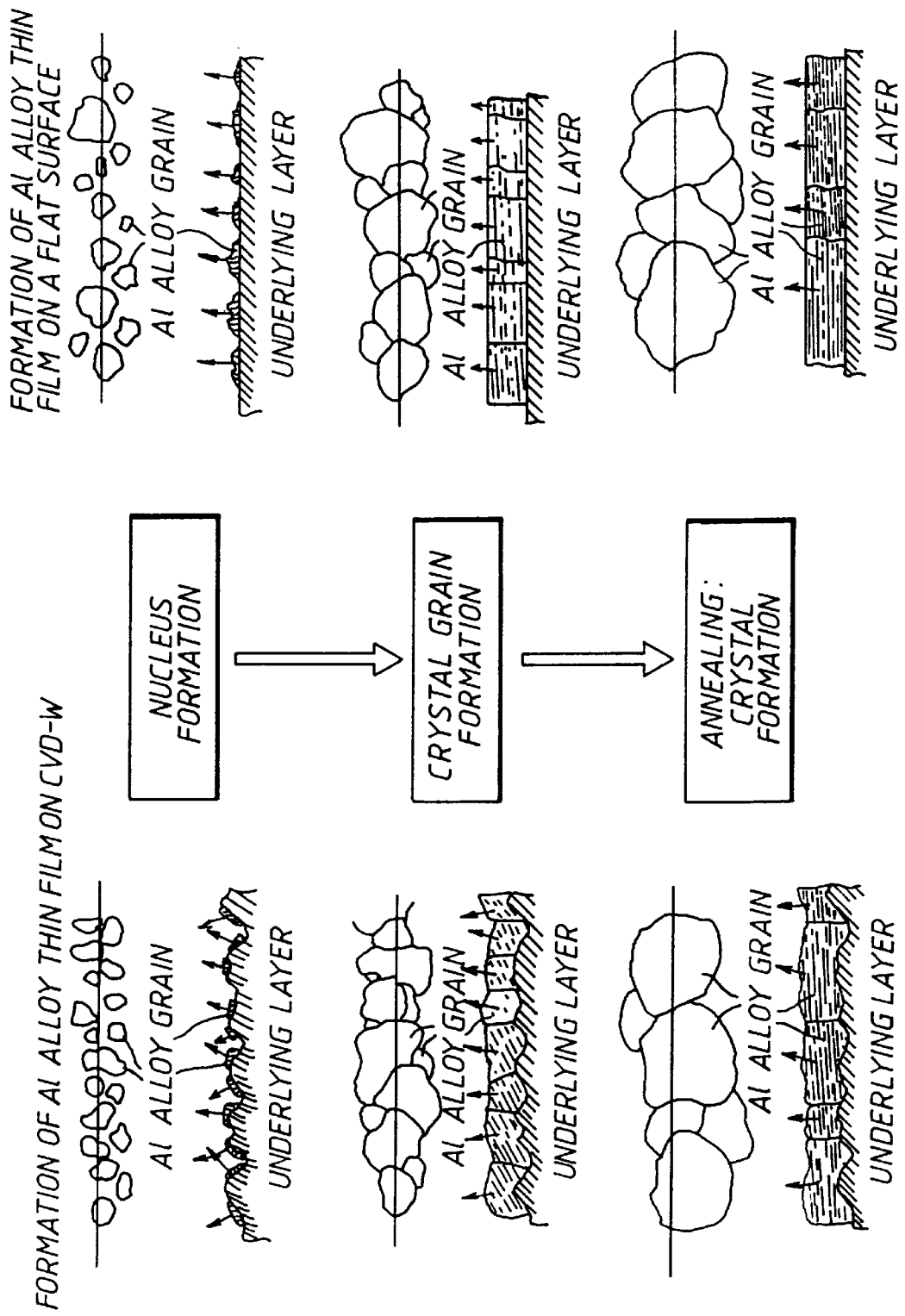
FIG. 10 is a descriptive diagram representationally showing the process of growth of Al crystal grains on a CVD-W film.
Figure 11:
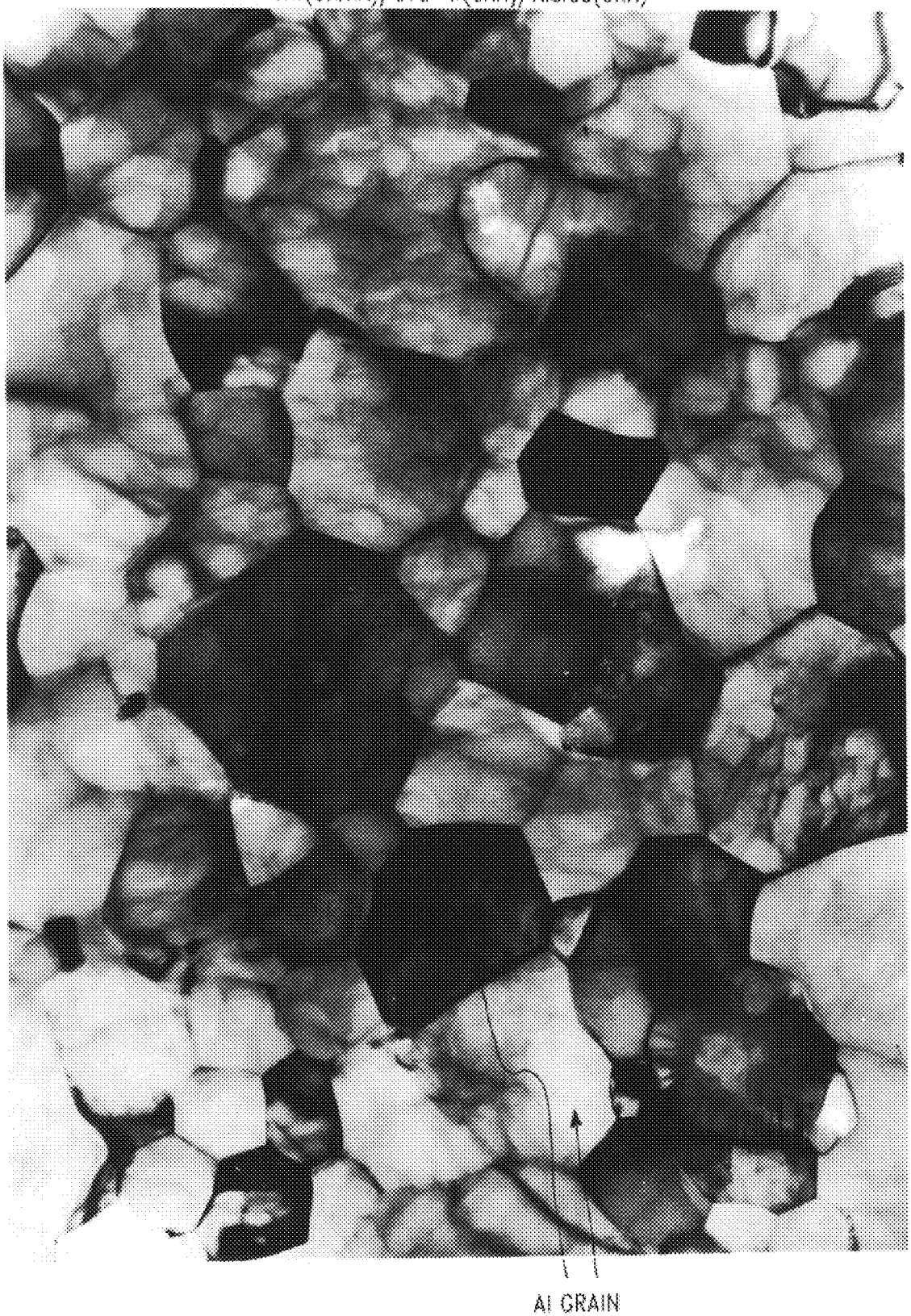
FIG. 11 is a TEM (transmission electron microscope) photograph of the stacked film assembly.
Figure 12:
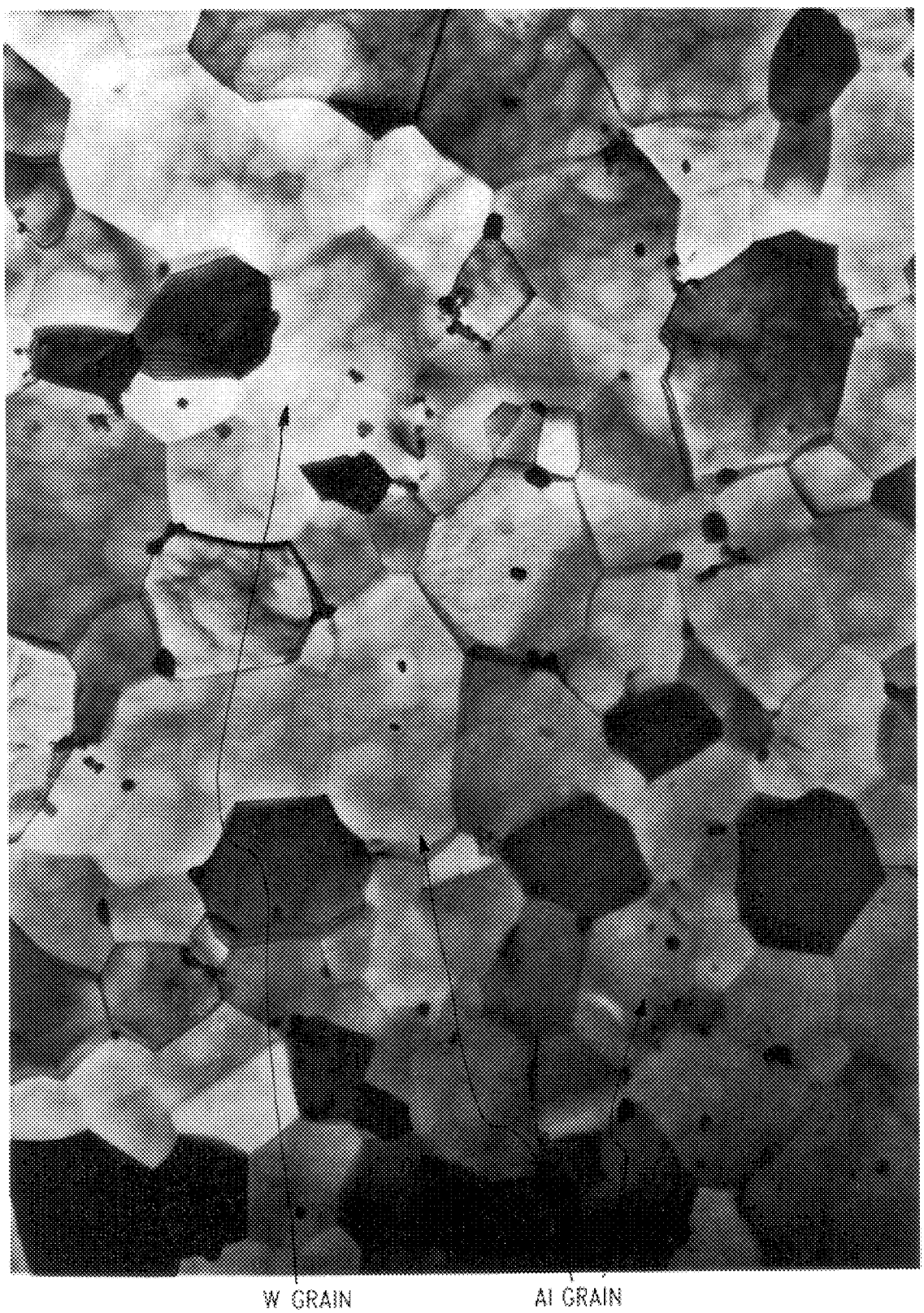
FIG. 12 is a TEM photograph of the stacked film assembly.
Figure 13:
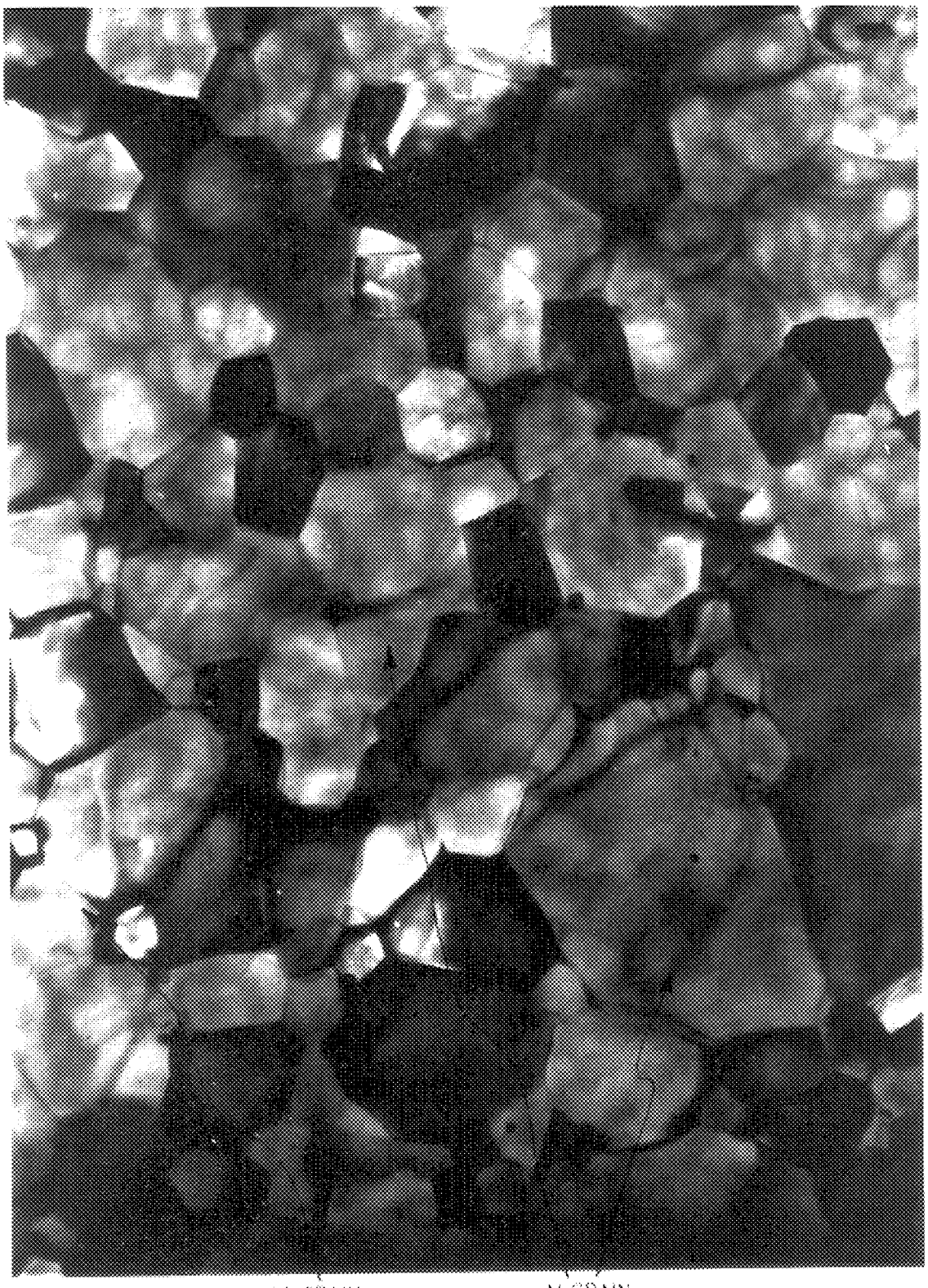
FIG. 13 is a TEM photograph of the stacked film assembly.
Figure 14:
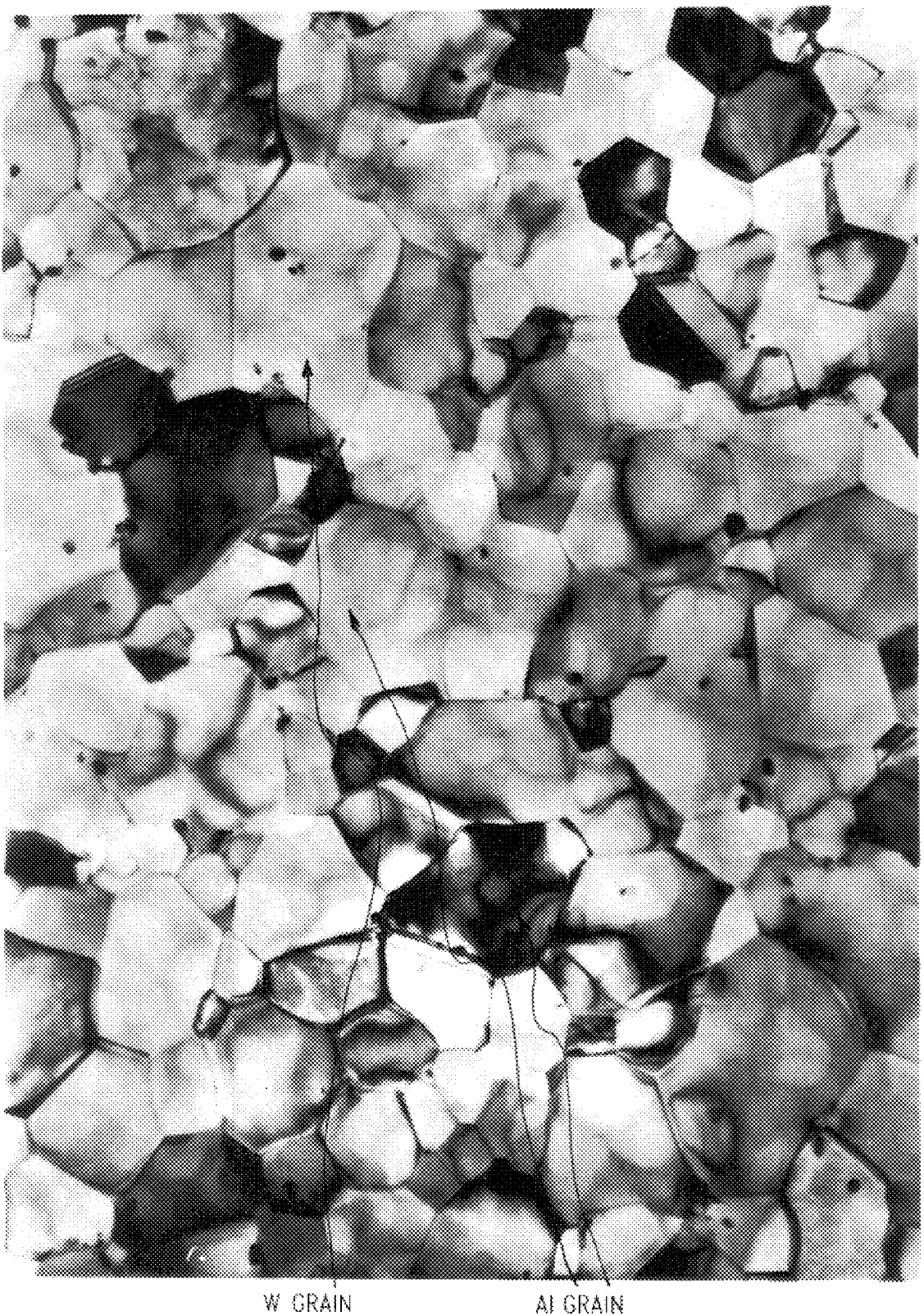
FIG. 14 is a TEM photograph of the stacked film assembly.

When Al alloy film is formed on CVD-W film, the effect of the underlying CVD-W film surface conditions on crystal orientation of the Al alloy film is thought to be as shown representationally in FIG. 10.

First, in the nucleus formation process, with an increase in movement energy of condensed atoms, an orientation as shown by the arrows is exhibited. As in Thornton's report, orientation will occur so that faces parallel to the surface will become the most densely packed faces. Thus, in Al, (111) orientation is seen. In CVD-W, when surface roughness is large, as in FIG. 10, there will be variation in the crystal direction of the nuclei formed. In contrast to this, with a flat surface, there will be no variation in the crystal direction of the nuclei formed.

Accompanying nucleus growth, connected crystal grains will be provided. The disappearance of grain boundaries will be caused by crystal grain growth, and one crystal grain direction will be exhibited. Crystal grain growth and grain boundary disappearance are repeated. On the CVD-W film, crystal grain growth and grain boundary disappearance are repeated while variation in crystal direction during nucleus formation is maintained. In contrast to this, since there is no variation in crystal direction during nucleus formation with a flat surface, crystal grain growth and grain boundary disappearance are repeated while this is maintained.

Even with crystal growth by annealing, initial crystal direction variation during nucleus formation will not be eliminated.

From this analysis, making the surface of the underlying CVD-W film as flat as possible is ideal, and in the range where Ra≦100 Å, according to this invention, sufficient Al (111) orientation can be realized.

Next, results of observing the grain conditions in the aforementioned CVD-W/Al stacked film assembly will be explained with reference to FIGS. 11–23.

Concerning lattice matching of the CVD-W and Al, the CVD-W film has both (110) and (200), from the results of the aforementioned XRD (Θ–2Θ) method). Orienting ability is poor, and it can be considered to nearly be a randomly oriented polycrystalline grain. When Al is deposited on this type of CVD-W film, it is difficult to consider the crystal growth as matching the direction of the underlying CVD-W film. In fact, when the crystal structure and lattice constant of W and the crystal structure and lattice constant of Al are compared, it is obvious that Al (111) does not match W (110) and (200).

Looking at the surface TEM photographs of TiW/CVD-W/AlSiCu (after the aforementioned heat treatment) shown in FIGS. 11–14, the CVD-W crystal grains and Al crystal grains can be viewed simultaneously. Compared to the CVD-W film crystal grains, the Al crystal grains are about 5–10 times larger. It is also suggested by this that there is no lattice matching.

Figure 15:
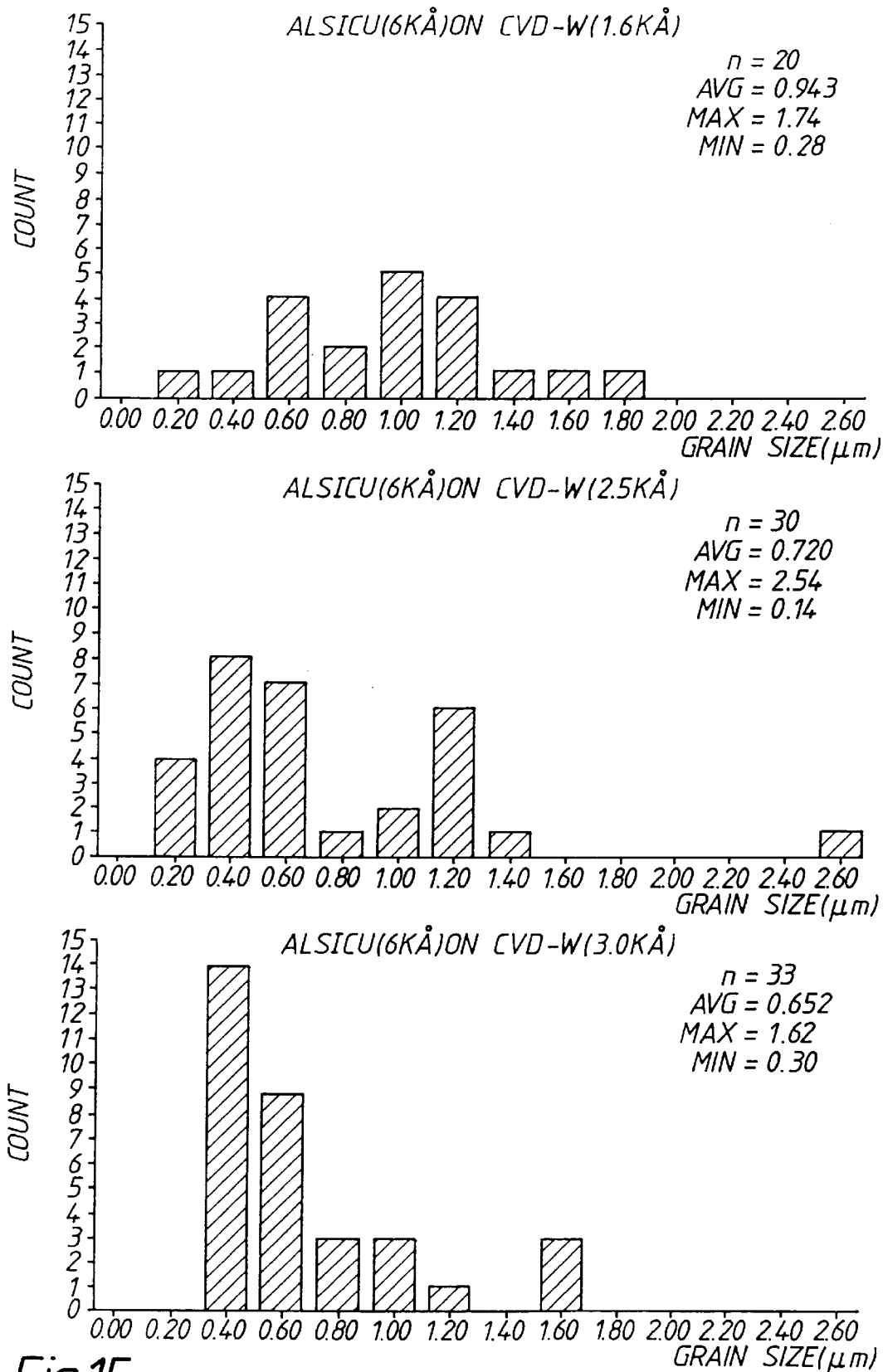
FIG. 15 is an Al crystal grain size distribution diagram based on TEM of the stacked film assembly.
Figure 16:
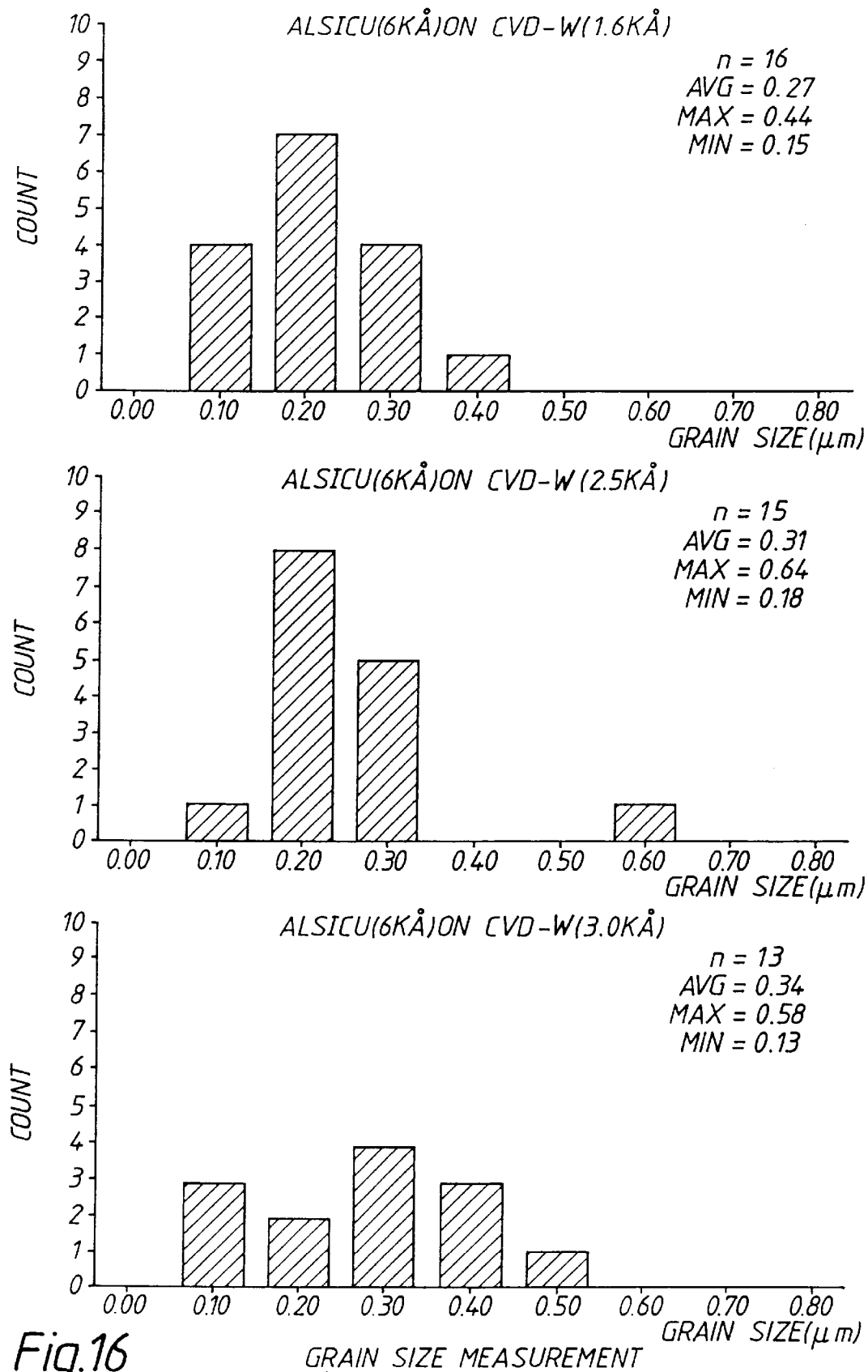
FIG. 16 is an Al crystal grain size distribution diagram based on AFM (atomic force microscope) of the stacked film assembly.
Figure 17:
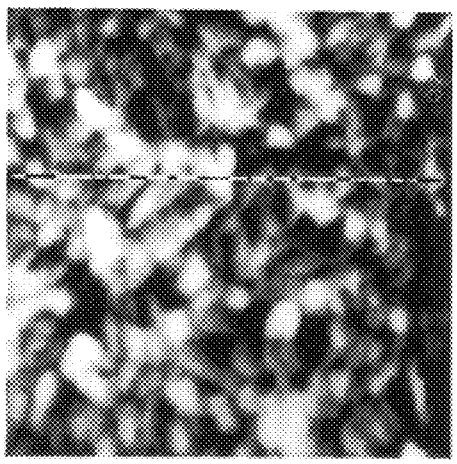
FIG. 17 is a plane image of each type of stacked film assembly using AFM.
Figure 18:
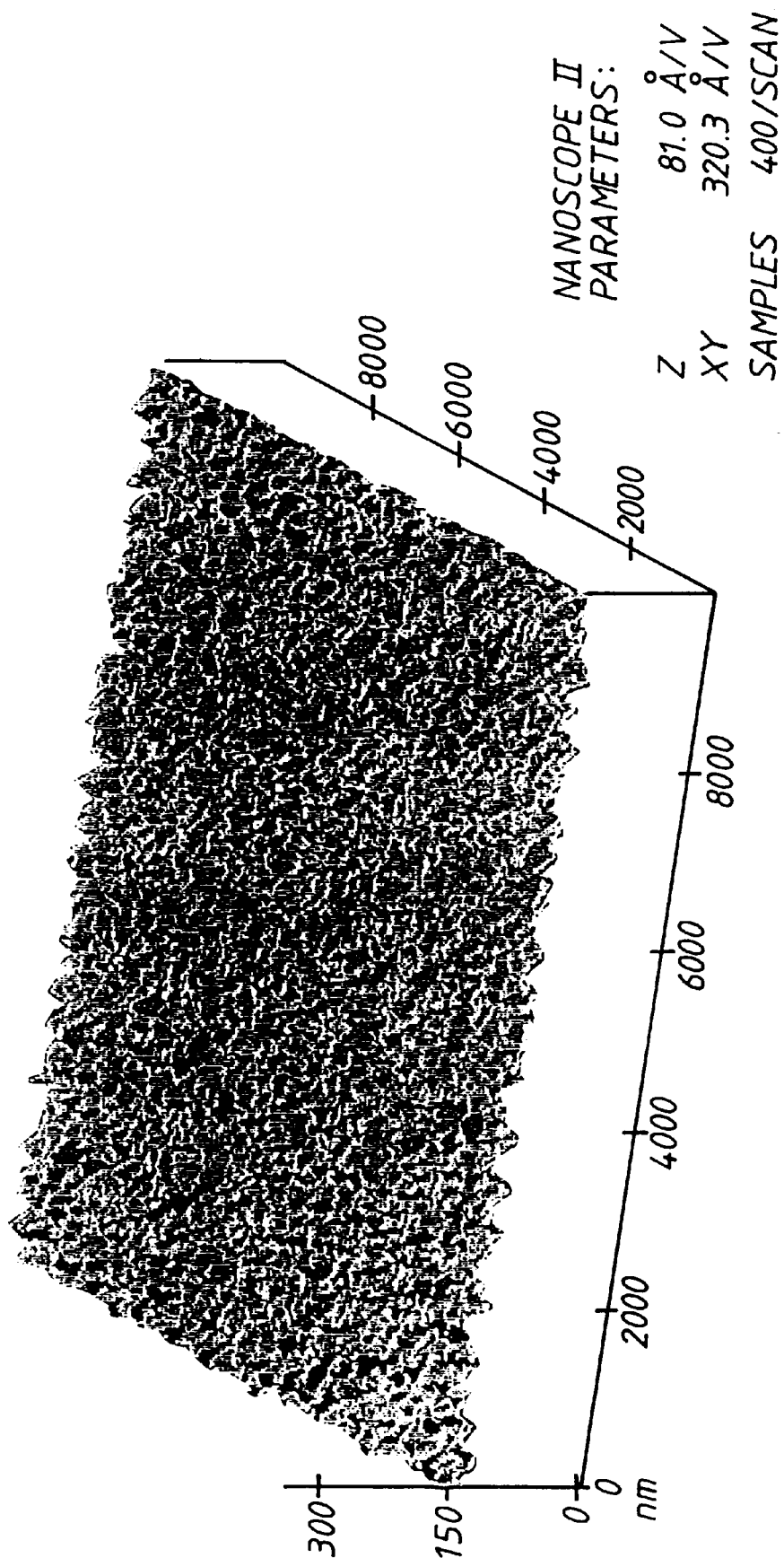
FIG. 18 is a three-dimensional image of a CVD-W film using AFM.
Figure 19:
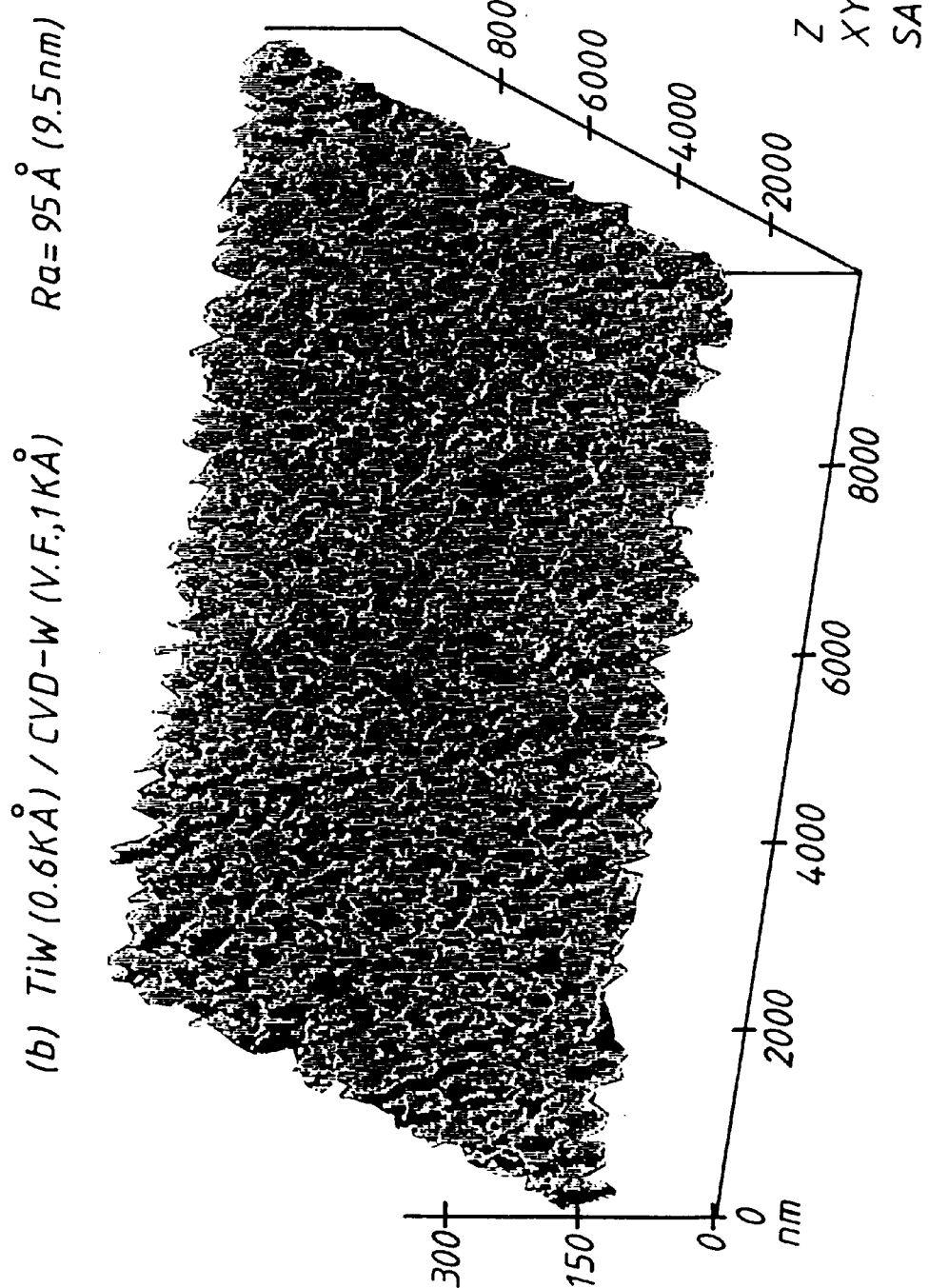
FIG. 19 is a three-dimensional image of a CVD-W film using AFM.
Figure 20:
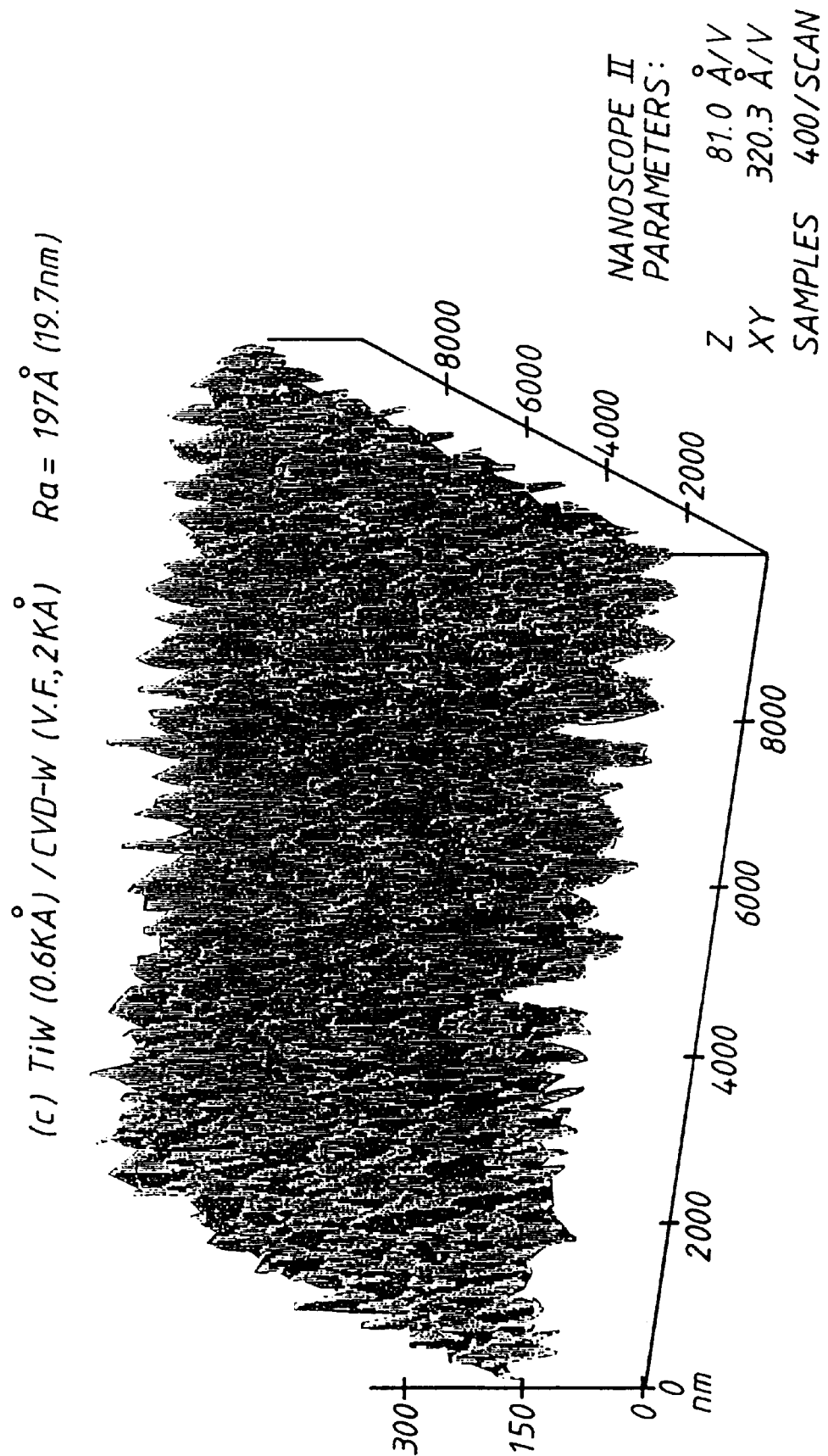
FIG. 20 is a three-dimensional image of a CVD-W film using AFM.
Figure 21:
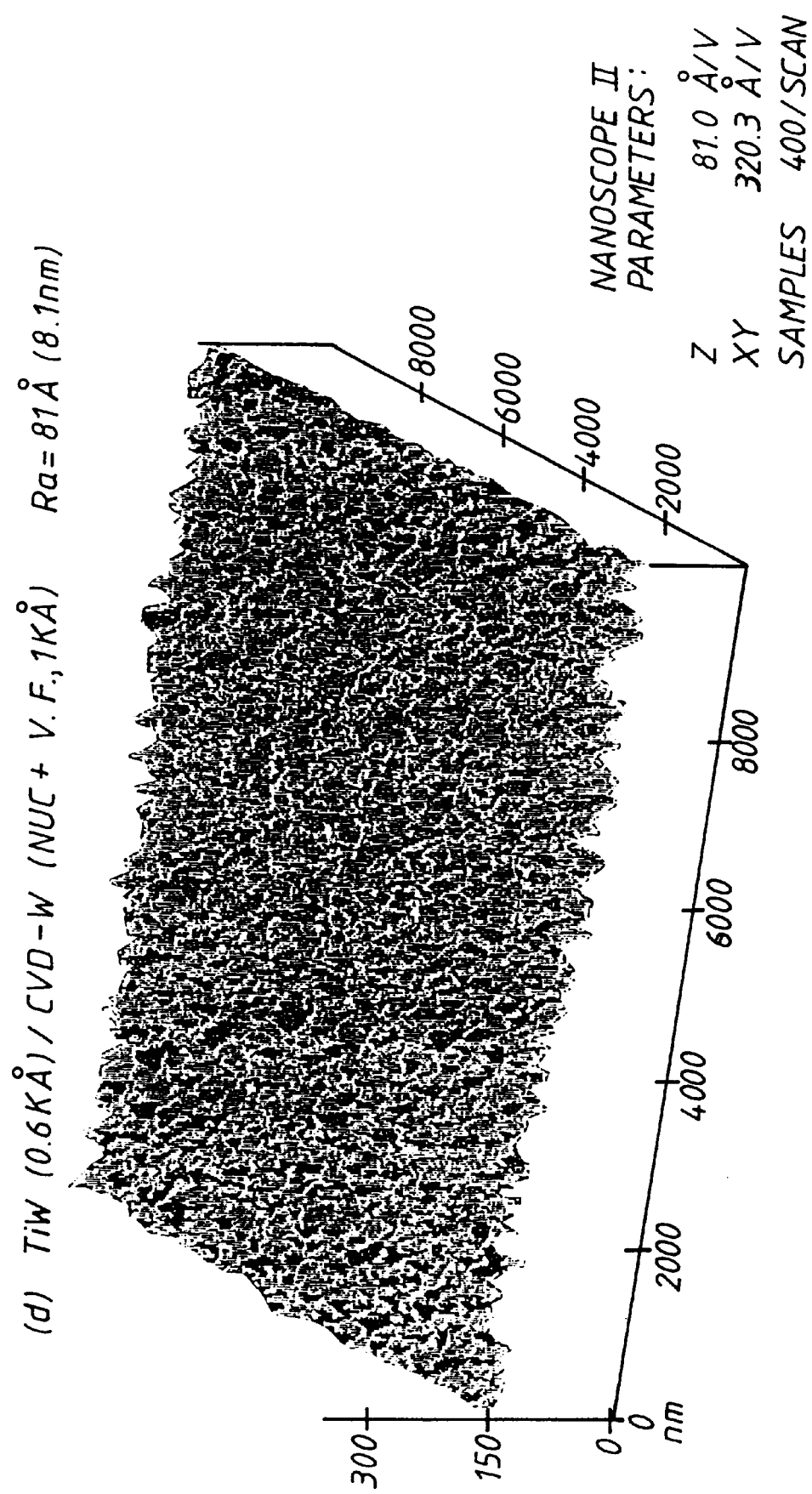
FIG. 21 is a three-dimensional image of a CVD-W film using AFM.
Figure 22:
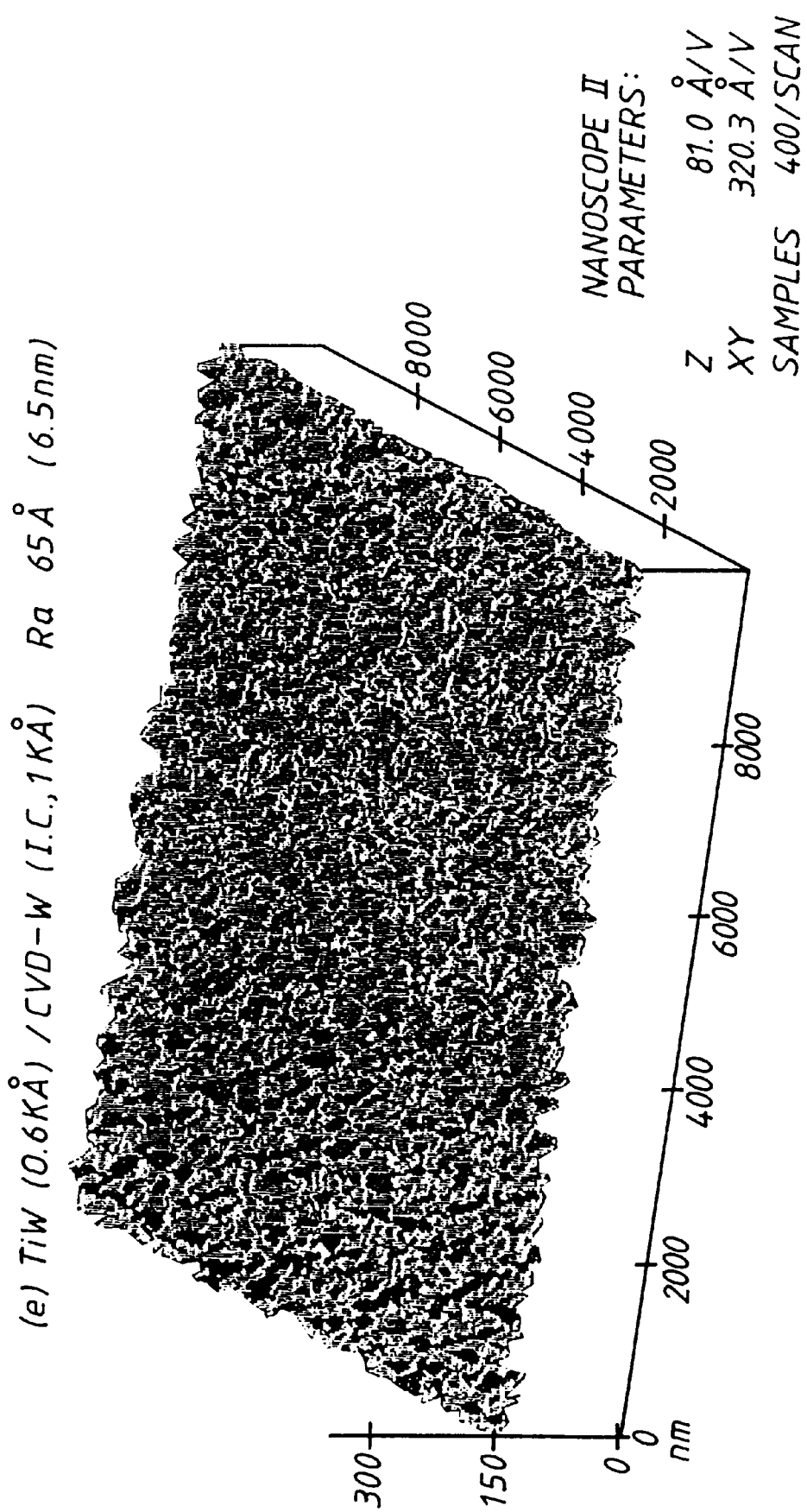
FIG. 22 is a three-dimensional image of a CVD-W film using AFM.
Figure 23:
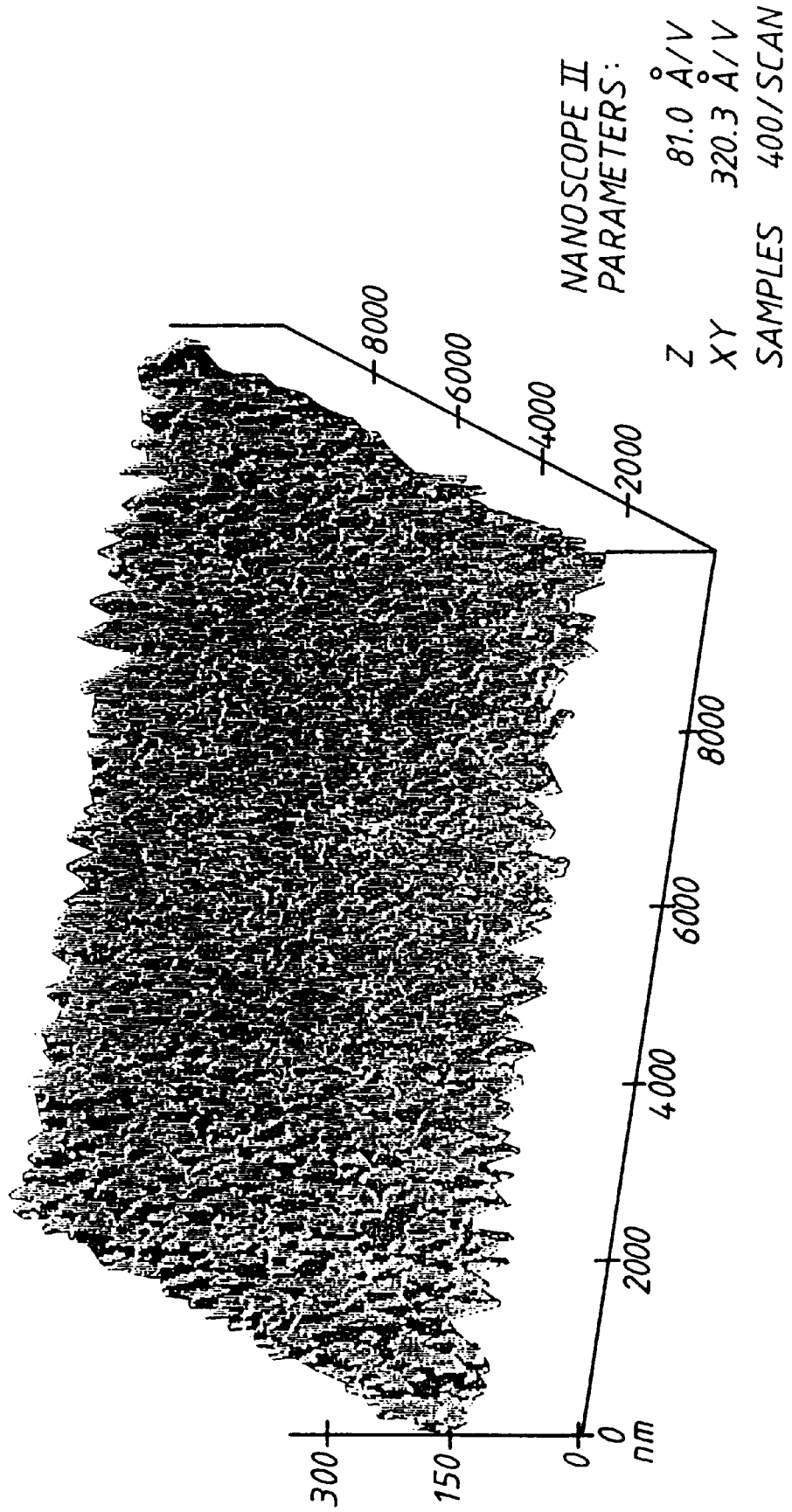
FIG. 23 is a three-dimensional image of a CVD-W film using AFM.

Next, the determination of the Al surface topology is discussed. As shown in FIGS. 15 and 16, it is clear that Al crystal grain diameter obtained from TEM photographs and Al surface unevenness, observed using AFM, judged to be crystal grains, do not agree. It can be recognized that Al surface topology is not that of the Al crystal grain unit period, but rather has a period near the CVD-W crystal grain diameter. Thus, it is believed that Al surface topology follows the unevenness caused by CVD-W surface crystal grains.

Distinct boundaries (grain boundaries) are observed in each of the TEM photographs shown in FIGS. 11–14. In contrast to this, the discerning of boundaries in the AFM images (FIG. 17) is somewhat difficult, and in the results of measuring grain size, a difference in the average value in the degree of magnification is recognized.

Next, what determines Al crystal grain diameter and crystal orientation is discussed. From FIGS. 15–17, in TiW (0.6 kÅ)/CVD-W (1.5–3.0 kÅ)/AlSiCu (6.0 kÅ), as the CVD-W film increases from 1.5 kÅ to 3.0 kÅ in thickness, Al crystal grain diameter shows a tendency to be reduced from 0.94 μm to 0.65 μm. In contrast to this, from FIGS. 5 and 6, in TiW (0.6 kÅ)/CVD-W (0.5–2.0 kÅ)/AlSiCu (5.0 kÅ), almost no change was observed in Al crystal grain diameter, which remained at 1.0 μm, even when the thickness of the CVD-W film increased from 0.5 kÅ to 2.0 kÅ. As shown in FIG. 1, however, Al (111) diffraction intensity showed a tendency to fall.

From the AFM data shown in FIGS. 18–23, it can be seen that, as CVD-W film thickness increases, surface roughness increases. In addition, it can be seen that surface roughness can be changed by changing CVD-W film formation conditions while keeping film thickness constant.

From the data in each of the tests shown above, it is thought that all the CVD-W film characteristics generally change in the directions shown in Table I below, depending on film thickness.

TABLE I

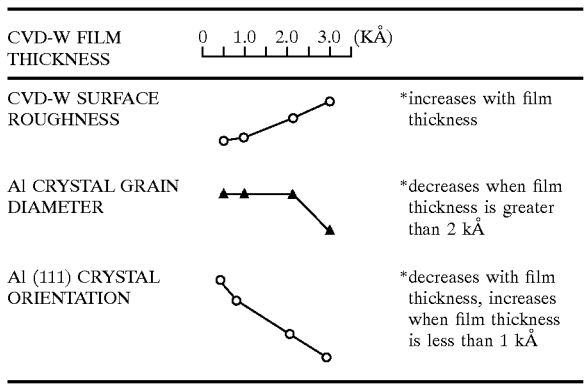

In short, with surface roughness (Ra=less than 200 Å) that corresponds to CVD-W film thickness of less than 2.0 kÅ, no change in Al crystal grain diameter is seen and an increase in Al (111) orientation is seen. This tendency is especially noticeable when CVD-W film thickness is less than 1.0 kÅ (surface roughness Ra=100 Å or less) (refer to FIG. 1). Conversely, Al crystal grain diameter will become smaller and Al (111) orientation will also deteriorate for surface roughness that corresponds to CVD-W film thickness that exceeds 2.0 kÅ.

Figure 24:
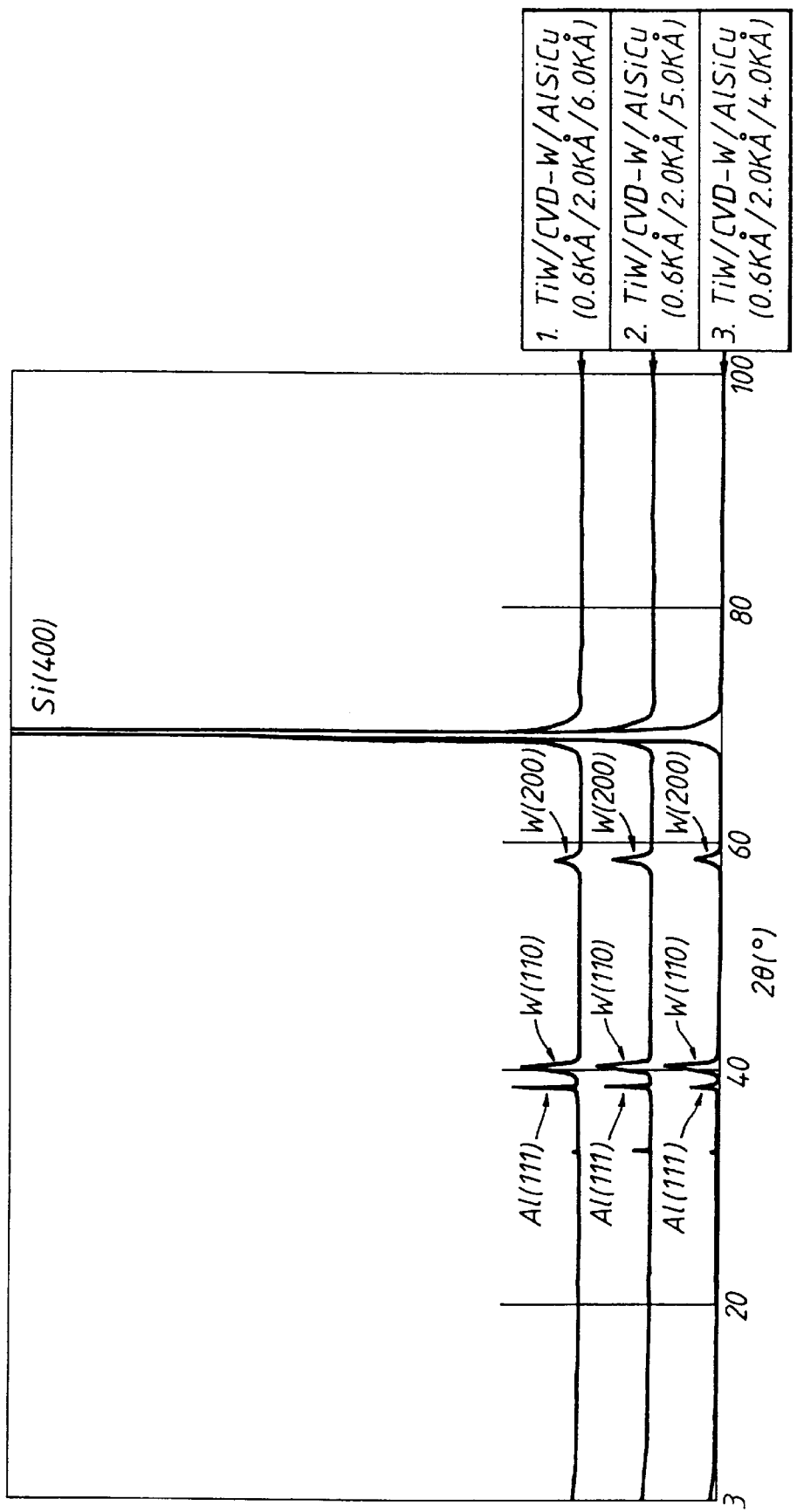
FIG. 24 is an X-ray diffraction spectrum diagram based upon top film (Al alloy film) thickness in each type of stacked film assembly.

An X-ray diffraction spectrum like that shown in FIG. 24 was obtained pertaining to how crystal orientation characteristics change relative to changes in AlSiCu film thickness (AlSiCu film thickness interdependence with TiW/CVD-W/AlSiCu film crystal orientation).

Based on this, it is seen that the Al (111) peak will be larger with an increase in AlSiCu film thickness. It is believed that this is due to the fact that, as film thickness increases, crystal growth progresses, crystal grain diameter grows larger, and crystal orientation characteristics improve.

Next, evaluation of the actual characteristics of stacked film assemblies constructed in accordance with this invention will be explained.

(1) EM resistance:

EM resistance, when CVD-W surface roughness was decreased and Al (111) crystal orientation increased by changing film thickness from 2.0 kÅ to 0.5 kÅ, was measured under the following conditions. The results obtained are the data shown in Table 2 below: MTF (generally expresses life until wiring disconnects=average breakdown time, but [here] expressed by the time needed for changes in wiring resistance to reach 2%, 6% and 11%.) Here, in addition, ARC-TiW (film to prevent halation during photoetching) was provided on the AlSiCu.

Sample: TiW (0.6 kÅ)/CVD-W (0.5–2.0 kÅ)/AlSiCu (5.0 kÅ)/ARC-TiW (0.2 kÅ)

Test conditions: current density=$3 \times 10^6$ Å/cm2 temperature=150° C.

stacked film line width=2.0 μm stacked film length=10 μm

TABLE II

| | MTF [hours] (standard deviation) | | |
|---|---|---|---|
| | Rate of increase in resistance: 2% | Rate of increase in resistance: 6% | Rate of increase in resistance: 11% |
| CVD-W:0.5KÅ(Ra 63Å) | 77.9(0.26) | 121.1(0.28) | 159.0(0.29) |
| CVD-1:1.0KÅ(Ra 95Å) | 43.5(0.19) | 63.8(0.17) | 80.3(0.16) |
| CVD-W:2.0KÅ(Ra197Å) | 24.3(0.17) | 37.2(0.16) | 47.8(0.14) |

Figure 25:
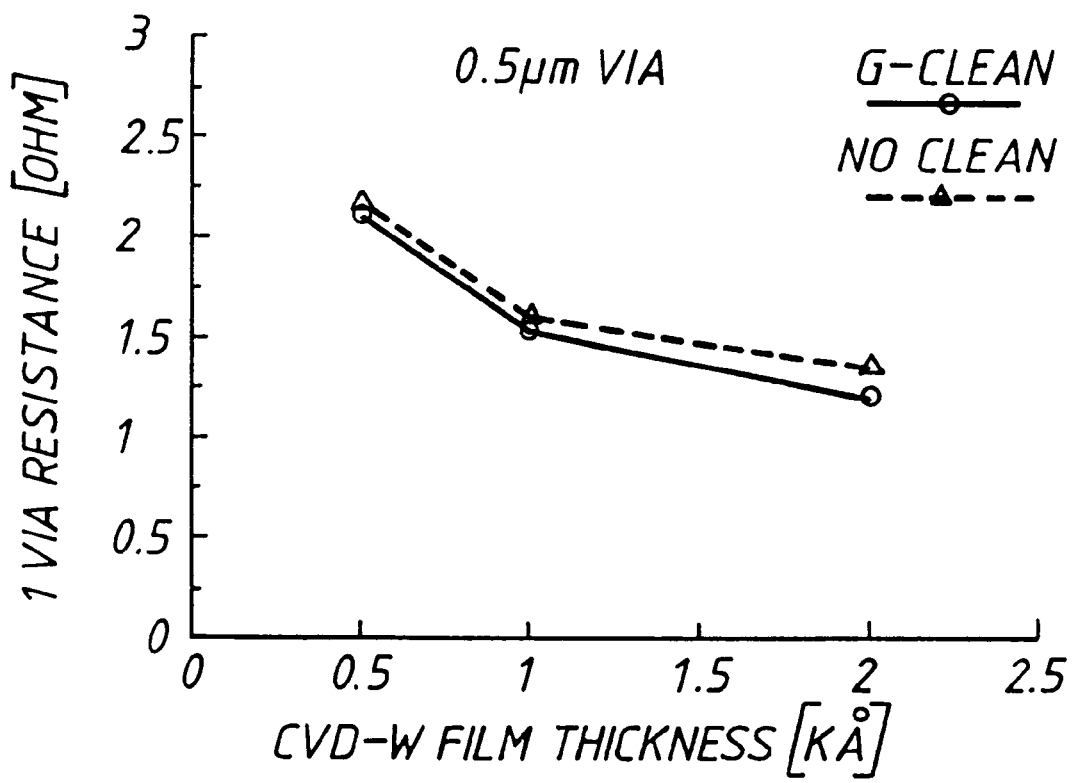
FIG. 25 is a graph showing changes in VIA resistance (contact resistance) caused by the thickness of the CVD-W film in the stacked film assembly.

As is clear from these results, if CVD-W film surface roughness (Ra) is kept to less than 100 Å, or further, to less than 65 Å, by controlling film thickness in accordance with this invention, MTF is greatly increased, and it can be seen that EM resistance is remarkably improved. Furthermore, MTF standard deviation hardly changes with each of these conditions. These results can be considered to agree qualitatively with the previously mentioned equation of S. Vaidya. In short, it is concluded that EM resistance can be improved by decreasing CVD-W surface roughness and increasing Al (111) crystal orientation. (2) VIA resistance (contact resistance):

0.5 μm contact holes were provided and VIA contact (underlying wiring was a CVD-W film) in stacked film assemblies based on this invention was measured. As shown in FIG. 25 (in the figure, G-CLEAN indicates items cleaned with very low concentration hydrofluoric acid), even when CVD-W film thickness was changed in the range of from 2.0 kÅ to 0.5 kÅ, VIA contact rose no more than between 1.2 Ω and 2.1 Ω, with no great difference in this change. It is judged that with CVD-W Ra≦100 Å (with film thickness ≦1.0 kÅ), resistance will also be in a usable range.

(3) Step coverage (rate of step coverage):

The results shown in Table III below were obtained when stacked film assemblies based on this invention were formed for 0.5 µm contact holes.

TABLE III

|  | CVD-W:500 Å THICKNESS | CVD-W:1000 Å THICKNESS | CVD-W:2000 Å THICKNESS |
|---|---|---|---|
| Hole side wall | 66.7% | 90.9% | 90.9% |
| Hole bottom section | 100% | 100% | 100% |

From these results, it can be seen that there is a tendency for the step coverage rate to fall when CVD-W film thickness is reduced from 2 kÅ to 0.5 kÅ, but even when CVD-W Ra≦100 Å (with film thickness ≦1.0 kÅ) based on this invention, sufficient step coverage, from an application standpoint, is exhibited.

The stacked film assembly based on this invention as described above can be installed as wiring in a semiconductor device, as shown in FIG. 26. Here, with halation prevention film 34, indicated by the imaginary lines, formed of TiW, etc., the reflection of exposure light during patterning of the wire by photoetching can be reduced (with TiW, a reflection rate of no more than 45% to Al 100%, and with TiN, a reflection rate of no more than 15%). The film can be exposed in the target pattern with a photoresist, and wire patterning precision will be increased as a result. Although this halation prevention film 34 is preferable, it is omitted from the figures below.

Figure 27:
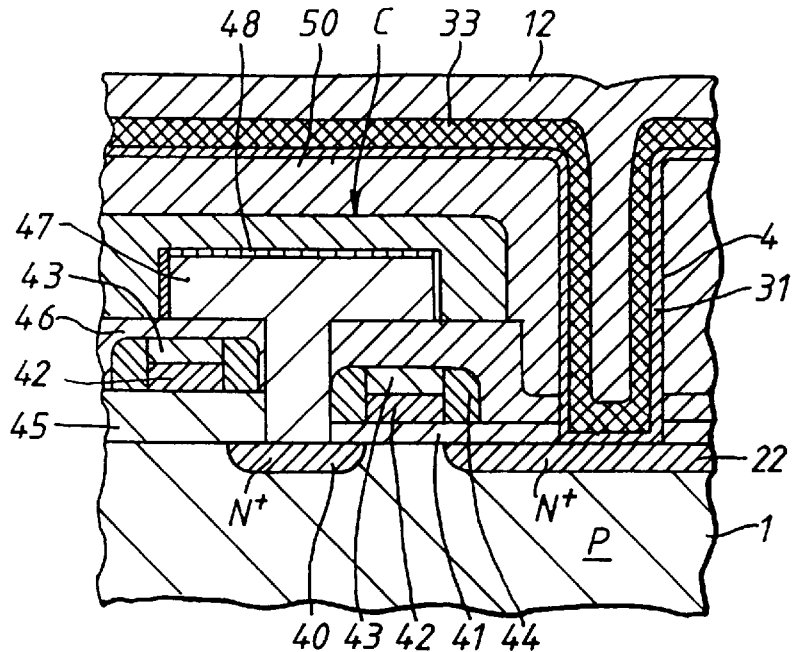
FIG. 27 is a cross sectional view of a DRAM memory cell with the wiring serving as a bit line.

FIG. 27 shows a DRAM (64MB application, for example) memory cell in which a stacked film assembly based on this invention has been installed. In FIG. 27, the memory cell comprises an n+ source region 40 and an n+ drain region 22, a gate oxide film 41, a polysilicon gate electrode 42, an $SiO_2$ film 43, a nitride film 44 produced by a side wall technique, an insulation layer 45, an interlayer insulation film 46, a storage node 47, a dielectric film 48, a field plate 49, and an interlayer insulation film 50.

This DRAM is made with a capacitor C connected to source region 40, in a stacked construction. This capacitor may be the well-known RPSTT (reverse plate stacked trench) construction, or constructed by stacking storage node polysilicon-dielectric film-field plate sequentially inside the trench by a normal STT (stacked in trench) procedure.

Then, the stacked film assembly based on this invention is adhered to contact hole 4 on drain region 22 as the aforementioned blanket type of wiring already described and is installed as the bit line on interlayer insulation film ($SIO_2$) 50; it is extremely effective for a highly integrated device, because of the outstanding characteristics already mentioned.

Figure 28:
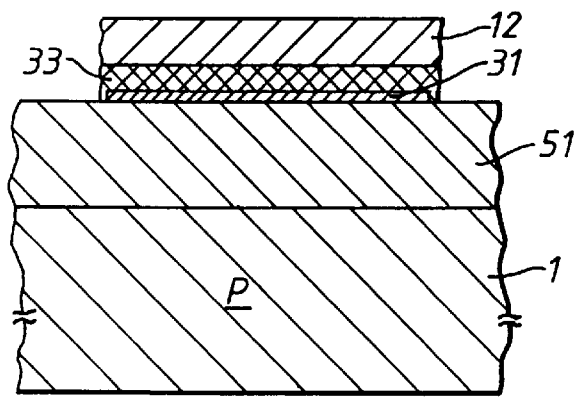
FIG. 28 is a schematic cross sectional view of a semiconductor device with the same wiring formed thereon.

FIG. 28 shows wiring made of the stacked film assembly based on this invention installed on insulation layer 51 as blanket type film. This figure is simplified, and there may be various films or wires beneath insulation layer 51. In addition, wiring made from the aforementioned stacked film assembly can be used as a multilayer wiring and it may be formed so that top and bottom wires are connected as upper or lower layer wiring via through-holes (omitted from the figure). When the aforementioned stacked film assembly is applied as an upper layer wiring on the through-hole, it can be formed in the same way as by adhesion to the contact hole shown in FIG. 26.

When the stacked film bottom layer CVD-W based on this invention will be the blanket type, the NUC. method or (NUC.+V.F.) method described above is appropriate. This allows uniform W growth in the bottom section and side wall sections of the contact hole by the seeding described above using $SiH_4$ feed. In this case, adhesive film 31 should be provided to give sufficient adhesion.

Figure 29:
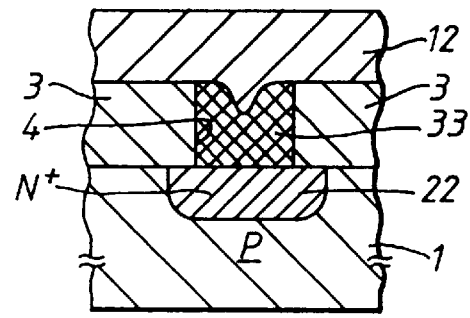
FIG. 29 is a schematic cross sectional view of a semiconductor device with the stacked film assembly formed as wiring (CVD-W is the selectively formed type).
Figure 30:
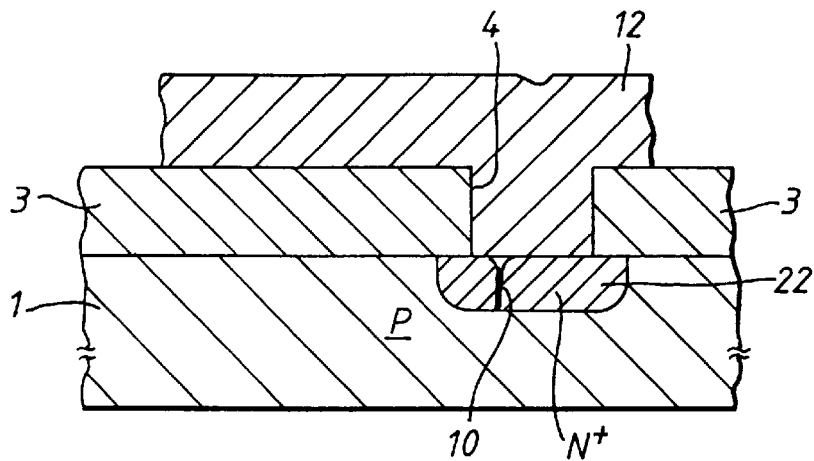
FIG. 30 is a schematic cross sectional view of a semiconductor device having a conventional single layer wiring formed thereon.
Figure 31:
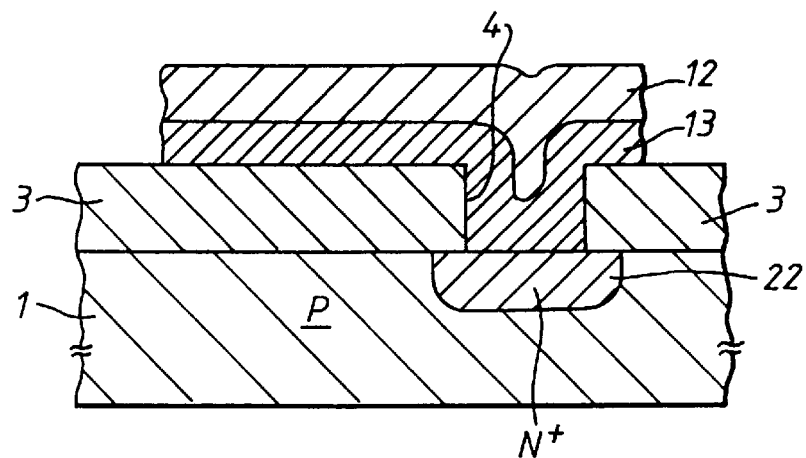
FIG. 31 is a schematic cross sectional view of a semiconductor device with a conventional stacked film assembly formed as wiring.
Figure 32:
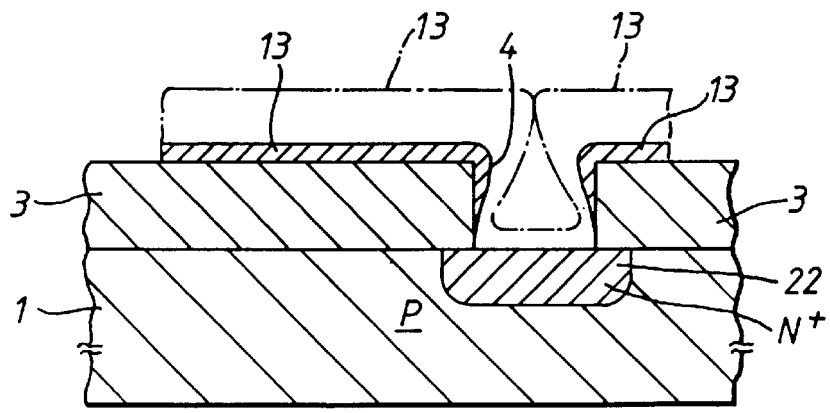
FIG. 32 is a cross sectional view similar to FIG. 31 and showing a step coverage state in the same wiring.

FIG. 29 is an example of selective formation that is the opposite of the blanket type described above. When a CVD-W film is formed at a low temperature (200° C.–300° C.) at low pressure (100–1 mtorr), the electronegativity of $WF_6$ is high, it is adsorbed onto the silicon, and electron replacement occurs readily. For this reason, CVD-W film 33 can be selectively adhered directly onto silicon (in concrete terms, semiconductor region 22 of contact hole 4).

Although specific embodiments of this invention have been described, further variations of the described embodiments are possible on the basis of the technical concepts of this invention.

For example, the film formation conditions may be changed in various ways, including the stacked materials and number of layers in the stacked film assembly described above. In addition to CVD-W, CVD-TiN, CVD-Ti, etc. can be used for film formation.

In addition, the stacked film assembly based on this invention, aside from the goals mentioned above, also has a wide range of other applications when a stacked thin film construction is used, for example, when crystal orientation control of the top thin film is necessary for the purpose of obtaining certain characteristics, or when crystal orientation of the top thin film must be controlled by controlling the surface roughness of the underlying layer. It is also applicable to a variety of devices.

In accordance with the invention, a stacked film assembly to serve as wiring in a semiconductor device is constructed so that the surface roughness (Ra) of the underlying film will be less than 100 Å and so that crystal orientation of the top film formed on this surface will be controlled. Thus, even with no lattice matching of the bottom and top films, crystal orientation of the top film can be sufficiently controlled to reach a target ((111) face with aluminum film), and in particular it will be possible to readily construct stacked film assemblies having a satisfactory barrier function as well as sufficient EM resistance and with good film formation.

We claim:

1. A method for making a stacked film assembly including at least a top film and a bottom film, said method comprising:

providing a first film in an area, the first film being intended to serve as the top film of the stacked film assembly;

feeding a gaseous chemical compound in which the chemical elements required for the formation of a second film are contained into the area in which the first film is disposed, the second film being intended to serve as the bottom film of the stacked film assembly;

breaking down the gaseous chemical compound in which the chemical elements for the formation of the second film are contained; and forming the second film onto the first film by chemical vapor deposition of the chemical elements to be included in the second film as provided by the breaking down of the gaseous chemical compound, while controlling the surface roughness (Ra) of the second film in contact with the first film to be no greater than 100 Å.

2. A method of making a stacked film assembly as set forth in claim 1, wherein the breaking down of the gaseous chemical compound containing the chemical elements from which the second film of the stacked film assembly is to be made is accomplished by incorporating the gaseous chemical compound in a circulation gas having feed-limiting conditions causing the breakdown of the gaseous chemical compound to provide the chemical elements from which the second film of the stacked film assembly is to be made.

3. A method of making a stacked film assembly as set forth in claim 1, wherein the breaking down of the gaseous chemical compound containing the chemical elements from which the second film of the stacked film assembly is to be made is accomplished by incorporating the gaseous chemical compound in a highly reactive first circulation gas; and decomposing the resultant gaseous chemical compound after exposure to the first circulation gas under surface reaction limiting conditions by incorporating the resultant gaseous chemical compound after exposure to the first circulation gas in a second circulation gas that is less reactive as compared to the first circulation gas to provide available chemical elements for the formation of the second film.

4. A method of making a stacked film assembly as set forth in claim 2, further including forming the first film which is to serve as the top film in the stacked film assembly by one of the techniques including sputtering, chemical vapor deposition, and vapor deposition.

5. A method of making a stacked film assembly as set forth in claim 3, further including forming the first film which is to serve as the top film in the stacked film assembly by one of the techniques including sputtering, chemical vapor deposition, and vapor deposition.

6. A method of making a stacked film assembly as set forth in claim 3, wherein the formation of the second film of the stacked film assembly is accomplished by providing a first chemical, vapor deposition procedure to produce a first film portion of the second film from the chemical elements of the gaseous chemical compound when employed with the highly reactive first circulation gas; and providing a second chemical vapor deposition procedure to produce a second film portion of the second film from the chemical elements of the gaseous chemical compound when employed with the less reactive second circulation gas.

7. A method of making a stacked film assembly as set forth in claim 6, wherein the first and second chemical vapor deposition procedures provide relative thicknesses of the first and second film portions of the second film in the range of (5:5)–(3:7).

* * * * *